US010705378B2

(12) United States Patent
Tochigi et al.

(10) Patent No.: US 10,705,378 B2
(45) Date of Patent: Jul. 7, 2020

(54) EL ELEMENT, EL ELEMENT SUBSTRATE, LIGHTING DEVICE, DISPLAY DEVICE, AND LIQUID CRYSTAL DISPLAY DEVICE

(71) Applicant: TOPPAN PRINTING CO., LTD., Taito-ku (JP)

(72) Inventors: Kae Tochigi, Taito-ku (JP); Kohhei Moronaga, Taito-ku (JP)

(73) Assignee: TOPPAN PRINTING CO., LTD., Taito-ku (JP)

( * ) Notice: Subject to any disclaimer, the term of this patent is extended or adjusted under 35 U.S.C. 154(b) by 215 days.

(21) Appl. No.: 15/265,469

(22) Filed: Sep. 14, 2016

(65) Prior Publication Data

US 2017/0003547 A1    Jan. 5, 2017

Related U.S. Application Data

(63) Continuation of application No. PCT/JP2015/057300, filed on Mar. 12, 2015.

(30) Foreign Application Priority Data

Mar. 14, 2014  (JP) ................. 2014-051963
Mar. 14, 2014  (JP) ................. 2014-051964

(51) Int. Cl.
*G02F 1/13357* (2006.01)
*H01L 51/52* (2006.01)
(Continued)

(52) U.S. Cl.
CPC ..... *G02F 1/133606* (2013.01); *G02B 5/0242* (2013.01); *H01L 51/0096* (2013.01);
(Continued)

(58) Field of Classification Search
CPC ................ G02F 1/133606; H01L 51/5268
See application file for complete search history.

(56) References Cited

U.S. PATENT DOCUMENTS

2005/0142379 A1    6/2005 Juni et al.
2007/0267966 A1   11/2007 Numajiri et al.
(Continued)

FOREIGN PATENT DOCUMENTS

CN    1714460 A    12/2005
CN  102221720 A    10/2011
(Continued)

OTHER PUBLICATIONS

Combined Office Action and Search Report dated Sep. 25, 2017 in Chinese Patent Application No. 201580013624.X (with English language translation of the Office Action and English translation of categories of cited documents).
(Continued)

*Primary Examiner* — Alexander P Gross
(74) *Attorney, Agent, or Firm* — Oblon, McClelland, Maier & Neustadt, L.L.P.

(57) ABSTRACT

An EL element including an EL light-emitting structure including a light-emitting layer on a transparent electrode, and a counter electrode on the light-emitting layer, a translucent substrate, and a light scattering layer between the EL light-emitting structure and the translucent substrate, the light scattering layer having a first surface on a transparent electrode side and a second surface on a side of the translucent substrate. The light scattering layer includes light scattering particles which includes particles that form agglomerates in a portion of the first surface such that the portion of the first surface has a concavo-convex shape. The light scattering particles further include particles positioned in order along the second surface such that the second surface is smoother than the portion of the first surface having the concavo-convex shape.

20 Claims, 7 Drawing Sheets

(51) Int. Cl.
*G02B 5/02* (2006.01)
*H01L 51/00* (2006.01)

(52) U.S. Cl.
CPC ...... *H01L 51/5234* (2013.01); *H01L 51/5268* (2013.01); *H01L 51/5271* (2013.01); *G02F 2001/133607* (2013.01); *G02F 2201/44* (2013.01)

(56) References Cited

U.S. PATENT DOCUMENTS

| | | | |
|---|---|---|---|
| 2010/0060142 A1* | 3/2010 | Itou | B82Y 20/00 313/498 |
| 2010/0225229 A1 | 9/2010 | Hosoda et al. | |
| 2011/0096402 A1* | 4/2011 | Sun | G02B 1/04 359/599 |
| 2013/0331474 A1 | 12/2013 | Kida et al. | |
| 2015/0144900 A1* | 5/2015 | Lee | H01L 51/5268 257/40 |
| 2015/0323711 A1* | 11/2015 | Bessho | G02B 5/0242 349/71 |
| 2016/0365541 A1* | 12/2016 | Wehlus | C03C 14/004 |

FOREIGN PATENT DOCUMENTS

| | | |
|---|---|---|
| JP | 2002-260845 A | 9/2002 |
| JP | 2004-513484 A | 4/2004 |
| JP | 2004-354963 A | 12/2004 |
| JP | 2005-190931 A | 7/2005 |
| JP | 2006-286616 A | 10/2006 |
| JP | 2007-242286 A | 9/2007 |
| JP | 2008-26618 A | 2/2008 |
| JP | 2010-205650 A | 9/2010 |
| JP | 2011-242759 A | 12/2011 |
| JP | 2011-253092 A | 12/2011 |
| JP | 2014-17233 A | 1/2014 |
| TW | 201336342 A1 | 9/2013 |
| WO | WO 2002/037580 A1 | 5/2002 |
| WO | WO 2005/115740 A1 | 12/2005 |
| WO | WO 2013/105626 A1 | 7/2013 |

OTHER PUBLICATIONS

International Search Report dated Jun. 16, 2016 in PCT/JP2015/057300, filed Mar. 12, 2015.
Notification of Reasons for Rejection dated Jan. 9, 2018 in Japanese Patent Application No. 2014-051964, with English translation, 5 pages.

* cited by examiner

EL ELEMENT, EL ELEMENT SUBSTRATE, LIGHTING DEVICE, DISPLAY DEVICE, AND LIQUID CRYSTAL DISPLAY DEVICE

CROSS-REFERENCE TO RELATED APPLICATIONS

The present application is a continuation of International Application No. PCT/JP2015/057300, filed Mar. 12, 2015, which is based upon and claims the benefits of priority to Japanese Application No. 2014-051963 filed Mar. 14, 2014, and Japanese Application No. 2014-051964 filed Mar. 14, 2014. The entire contents of all of the above applications are incorporated herein by reference.

BACKGROUND OF THE INVENTION

Field of the Invention

The present invention relates to an EL element (electro luminescence element), an EL element substrate, a lighting device, a display device, and a liquid crystal display device.

Discussion of the Background

Conventionally, devices using EL elements are known. For example, the EL elements are used for a display unit or a light source (light source for display) of a lighting device, a display device, and a liquid crystal display device, and as a light source for lighting.

As the above EL element, for example, a light-emitting structure is known in which a light-emitting layer including a fluorescent organic compound is sandwiched between a positive electrode and a negative electrode. Organic EL elements are often used which have a configuration in which the light-emitting structure is provided on one surface of a translucent substrate.

In the above organic EL element, a DC voltage is applied between the positive electrode and the negative electrode, and electrons and holes are injected into the light-emitting layer so as to be recombined, to generate excitons. The organic EL element emits light by using light emission when the excitons decay. Hence, of electrodes configuring the light-emitting structure, at least the light extraction side electrode is formed of a transparent electrode. Typically, the positive electrode provided on the translucent substrate is formed of a transparent electrode. The light emitted from the light-emitting layer is emitted to the outside through the transparent electrode and the translucent substrate.

However, according to the above EL element, when the light emitted from the light-emitting layer is emitted to the outside from the translucent substrate, part of the light is totally reflected from the surface of the translucent substrate (part of the light is totally reflected from the interface between the translucent substrate and the transparent electrode). This light is not emitted to the outside and attenuates while undergoing repeated internal reflection. This causes a problem that the amount of light is reduced. In this case, it is said that the efficiency of external light extraction (hereinafter, referred to as light extraction efficiency) of the EL element, with the amount of light being reduced, is typically about 20%.

When the light extraction efficiency is low as described above, more power is required to be supplied to produce the required luminance. In addition, increasing the supplied power increases the load on the EL element, and results in decreasing the reliability of the element itself.

Regarding the above problem, in order to improve the light extraction efficiency of the EL element, an EL element has been proposed in which fine concavities and convexities are provided to the translucent substrate to extract part of the light rays, which have been reduced by total reflection, to the outside. For example, Patent Literature 1 proposes forming a microlens array in which a plurality of microlens elements are arranged on one surface of the translucent substrate in a planar manner.

In addition, when the EL element described above is made to emit light with high luminance, a high drive current is required. Hence, the increase of the load on the EL element may result in a deterioration of the EL element.

Hence, an EL element is proposed in which an electrode, an EL layer, a high refractive index layer, and a translucent body are arranged in this order, and layers having a light scattering function are provided at the respective sides of light extraction surfaces of the high refractive index layer and the translucent body (for example, refer to Patent Literature 2).

Patent Literature 2 discloses a configuration in which transparent particles having refractive index differences are dispersed in a transparent resin matrix so that the configuration serves as a layer having a light scattering function at a light extraction surface side of a high refractive index layer.

Patent Literature 1: JP-A-2002-260845
Patent Literature 2: JP-A-2006-286616

SUMMARY OF THE INVENTION

According to one aspect of the present invention, an EL element including an EL light-emitting structure including a transparent electrode, a light-emitting layer on the transparent electrode, and a counter electrode on the light-emitting layer, a translucent substrate through which a light generated from the light-emitting layer is emitted to outside, and a light scattering layer positioned between the EL light-emitting structure and the translucent substrate, the light scattering layer having a first surface on a transparent electrode side and a second surface on a side of the translucent substrate. The light scattering layer includes light scattering particles, the light scattering particles include particles that form agglomerates in a portion of the first surface such that the portion of the first surface has a concavo-convex shape. The light scattering particles further include particles positioned in order along the second surface such that the second surface is smoother than the portion of the first surface having the concavo-convex shape.

According to another aspect of the present invention, an EL element substrate includes a translucent substrate, and a light scattering layer positioned on a surface of the translucent substrate and including a base material portion and scattering particles dispersed in the base material portion. The base material portion includes refractive index adjustment particles having light transmissivity mixed with a binder having light transmissivity such that a refractive index of the base material portion is adjusted to a value larger than a refractive index of the translucent substrate. The scattering particles include a transparent material having a refractive index different from the refractive index of the base material portion. The binder of the base material portion satisfies formula (1): $2 \leq W_H/W_A \leq 9 \ldots (1)$ where $W_H$ is a ratio by weight of the refractive index adjusting particles to the binder, and $W_A$ is a ratio by weight of the scattering particles to the binder.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
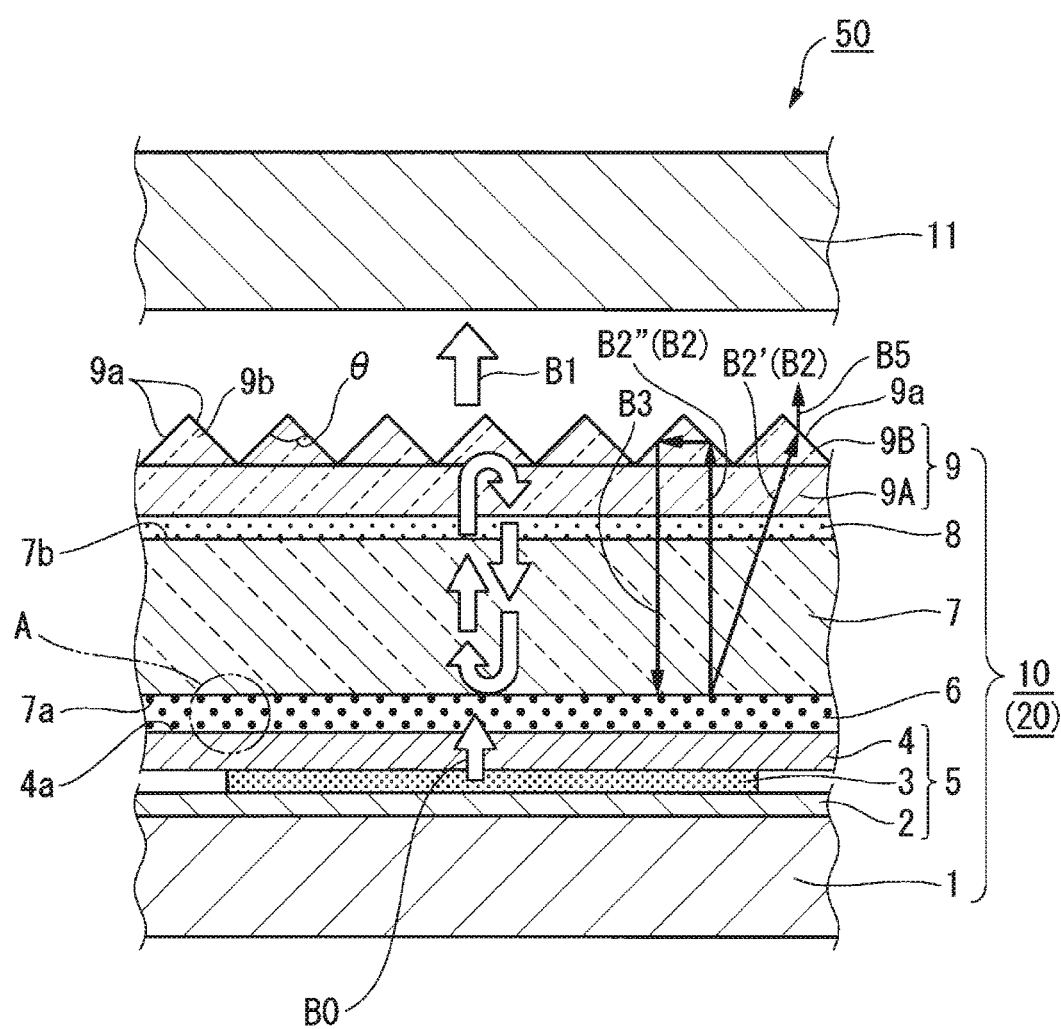
FIG. 1 is a sectional view schematically showing configurations of a liquid crystal display device and an EL element according to a first embodiment of the present invention.

Hereinafter, with reference to the accompanying drawings, embodiments to which the present invention is applied will be described in detail. Note that, the drawings used in the following descriptions are used for describing configurations of the embodiments of the present invention. Sizes, thicknesses, dimensions, or the like of parts shown in the drawings may differ from the dimensional relationship between an EL element, an EL element substrate, a lighting device, a display device, and a liquid crystal display device, which are in practical use.

First Embodiment

Hereinafter, the first embodiment of the present invention is described with reference to the accompanying drawings.

An EL element and a liquid crystal display device including the EL element according to the first embodiment of the present invention are described.

Figure 2:
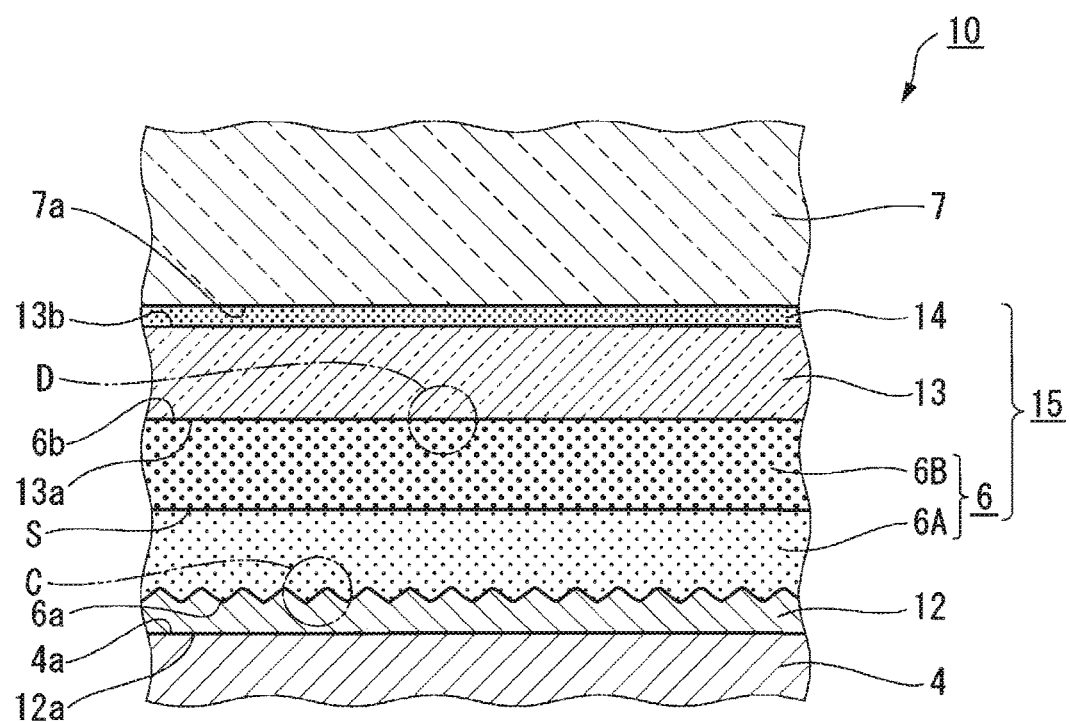
FIG. 2 is a partially enlarged view schematically showing a portion A of FIG. 1.
Figure 3A:
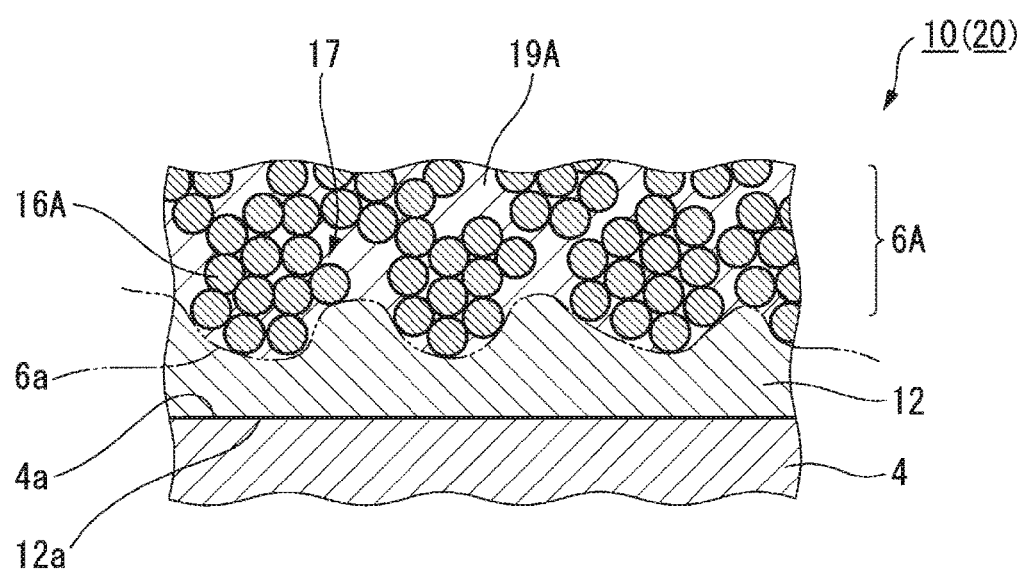
FIG. 3A is a partially enlarged view schematically showing a portion C of FIG. 2.
Figure 3B:
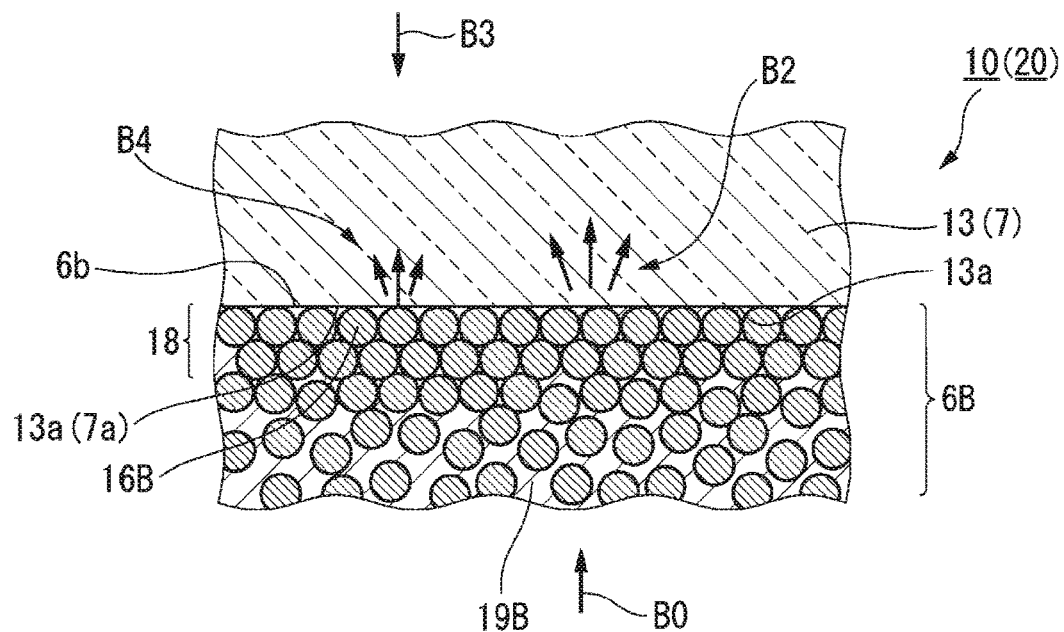
FIG. 3B is a partially enlarged view schematically showing a portion D of FIG. 2.

FIG. 1 is a sectional view schematically showing configurations of the liquid crystal display device and the EL element according to the first embodiment of the present invention. FIG. 2 is a partially enlarged view schematically showing a portion A of FIG. 1. FIG. 3A is a partially enlarged view schematically showing a portion C of FIG. 2. FIG. 3B is a partially enlarged view schematically showing a portion D of FIG. 2.

Note that, in the drawings used in the following descriptions, the scale of each part is appropriately changed so that each part is shown in a recognizable size.

As shown in FIG. 1, a liquid crystal display device 50 according to the first embodiment includes a liquid crystal panel 11 (image display element), and an EL element 10 according to the first embodiment. Note that "EL" is an abbreviation for electro luminescence.

The liquid crystal panel 11 is an image display element using liquid crystals. Various known configurations can be employed for the liquid crystal panel 11 though details thereof are not shown.

In a preferred configuration of the liquid crystal panel 11, for example, polarization states of a liquid crystal layer sandwiched between polarizing plates are individually controlled for respective pixels to change light transmittances of the pixels arranged in a rectangular shape in a plan view, thereby displaying an image. In this case, the polarization states of the liquid crystal layer are controlled by applying an electric field corresponding to an image signal by using electrodes, not shown, arranged for the respective pixels.

In the first embodiment, the EL element 10 is disposed on a back surface of the liquid crystal panel 11. The EL element 10 is a light-emitting part (light-emitting unit) for illuminating the liquid crystal panel 11 from the back surface, and configures a lighting device of the liquid crystal display device 50.

Hence, although the EL element 10 only needs to emit uniform illumination light to the liquid crystal panel 11, the EL element 10 has a plurality of light-emitting pixels, which can individually emit light, in the first embodiment. In FIG. 1, the structure of one light-emitting pixel is shown. Hence, in the EL element 10, a plurality of structures shown in FIG. 1 are formed adjacently in the horizontal direction and the depth direction as viewed in FIG. 1.

The schematic configuration of the EL element 10 includes a structure in which a counter substrate 1, a light-emitting structure 5 (EL light-emitting part), a light scattering layer 6, a translucent substrate 7, and a light directional film 9 are laminated in this order.

The light-emitting structure 5 is a part of the device and generates illumination light, which is illuminated to the liquid crystal panel 11, by EL light emission.

In the first embodiment, light B0 generated from the light-emitting structure 5 penetrates through the light scattering layer 6, the translucent substrate 7, and the light directional film 9 and is emitted to the outside as light B1, which is emitted to the liquid crystal panel 11.

Being "translucent" herein refers to translucency relating to the wavelength light of the light B0 generated from the light-emitting structure 5, unless otherwise specified.

The counter substrate 1 and the translucent substrate 7 are plate-like or sheet-like members arranged so as to be opposed to each other to sandwich the light-emitting structure 5 and the light scattering layer 6 therebetween.

In the first embodiment, the counter substrate 1 forms one outer surface that is perpendicular to the thickness direction of the EL element 10.

The counter substrate 1 is not particularly required to have translucency. Hence, an appropriate material, for example, synthetic resin, glass, metal or the like, on which the light-emitting structure 5 can be laminated, can be used for the counter substrate 1.

In the first embodiment, as an example, a material similar to that of the translucent substrate 7 described later is used for the counter substrate 1.

The light transmittance of the translucent substrate 7 is preferably 50% or more and is more preferably 80% or more, as a total light transmittance.

Various glass materials can be used for the translucent substrate 7. As other materials, synthetic resin materials can be used such as PMMA (polymethyl methacrylate resin), polycarbonate, polystyrene, PEN (polyethylene naphthalate resin), and PET (polyethylene terephthalate resin).

When synthetic resin materials are used, a cycloolefin polymer is particularly preferred. This polymer is excellent in all the material characteristics such as processability and heating resistance, water resistance, and optical translucency.

In the light-emitting structure 5, a transparent electrode 4, a light-emitting layer 3, and a counter electrode 2 are laminated in this order. The light-emitting structure 5 is disposed on the counter substrate 1 in a state where the counter electrode 2 faces the counter substrate 1.

In the light-emitting structure 5, by applying a voltage across the transparent electrode 4 and the counter electrode 2, the light-emitting layer 3 emits light. As the light-emitting structure 5, various conventionally known structures can be employed.

The transparent electrode 4 is one electrode (first electrode) for applying a voltage to the light-emitting layer 3 and is formed of a material through which the light B0 can penetrate. Examples of an electrode material having such translucency include ITO (indium tin oxide) and the like.

The counter electrode 2 is the other electrode (second electrode) for applying a voltage to the light-emitting layer 3. As the material for the counter electrode 2, a material similar to that of the transparent electrode 4 can be employed. However, in the first embodiment, since the presence or absence and the extent of translucency of the counter electrode 2 are not important, an appropriate metallic material having good electrical conductivity, for example, aluminum, silver, copper, and the like can also be employed as the material of the counter electrode 2.

In the first embodiment, to emit as much light B0 as possible from the light directional film 9, it is preferable that a material having a good light reflection function is used for the counter electrode 2. The light reflectance of the counter electrode 2 is preferably 50% or more and 100% or less.

When a material having a low light reflectance or a transparent material is used, it is preferable that a light reflection layer is provided between the counter electrode 2 and the counter substrate 1. This light reflection layer may be provided in between the counter electrode 2 and the counter substrate 1. Alternatively, the light reflection layer can be laminated on the counter substrate 1 or the counter electrode 2, or can be provided inside the counter substrate 1.

The counter substrate 1 can be made of a material having light reflectivity so that the counter substrate 1 also serves as a light reflection layer.

Polarities of the transparent electrode 4 and the counter electrode 2 are not particularly limited. However, in the first embodiment, as an example, the transparent electrode 4 is used as a positive electrode, and the counter electrode 2 is used as a negative electrode.

The light-emitting layer 3 may be, for example, a white light-emitting layer. In this case, a configuration may be employed in which the transparent electrode 4 is formed of ITO, and the counter electrode 2 is formed of aluminum. In the configuration, from the transparent electrode 4 toward the counter electrode 2, CuPc (copper phthalocyanine)/α-NPD doped with 1% rubrene/dioctyl anthracene doped with 1% perylene/Alq3/lithium fluoride are laminated in this order.

However, the configuration of the light-emitting layer 3 is not limited to this. Any configuration can be employed which uses an appropriate material that can set the wavelengths of light rays emitted from the light-emitting layer 3 to wavelengths corresponding to R (red), G (green), and B (blue).

In addition, when the liquid crystal display device 50 is used for a full color display, a configuration in which the light-emitting layer 3 is coated with three types of luminescence materials corresponding to R, G, and B, or a configuration in which color filters are stacked on a white light-emitting layer may be employed.

In the first embodiment, since emission of light from the EL element 10 is controlled for each of the light-emitting pixels, the light-emitting structure 5 is formed so as to correspond to each of the light-emitting pixels, and the transparent electrode 4 and the counter electrode 2 of each of the light-emitting pixels are connected to a drive part, not shown, by wires.

The light scattering layer 6 is a layered part through which the light, which has been generated from the light-emitting layer 3 and has entered the transparent electrode 4, penetrates to the translucent substrate 7 side. At the same time, the layered part changes the traveling direction of the light with scattering. The light scattering layer 6 includes one or more types of light scattering particles.

The light scattering layer 6 is configured to change a particle density of the light scattering particles so that the light B0 entering from the transparent electrode 4 can easily penetrate therethrough, and the light entering through the translucent substrate 7 can be easily reflected toward the translucent substrate 7.

Specifically, as schematically showing in FIG. 2, in the light scattering layer 6, a first light scattering layer 6A and a second light scattering layer 6B are formed between a first surface 6a and a second surface 6b.

Since FIG. 2 is a schematic view, a boundary surface S is shown between the first light scattering layer 6A and the second light scattering layer 6B. However, it is not essential that a physical interface is formed on the boundary surface S. For example, a configuration can be provided in which, between the first light scattering layer 6A and the second light scattering layer 6B, the particle density of the light scattering particles continuously changes, and no physical interface is formed.

In the first embodiment, the boundary surface S indicates a position of the boundary at which the particle density of the light scattering particles is changed in the process of preparation, and is not necessarily a physical interface.

The first light scattering layer 6A is a layered part disposed so that the first surface 6a faces the transparent electrode 4. In the first embodiment, the first light scattering layer 6A is joined to a surface 4a of the transparent electrode 4 via a smoothing layer 12.

As shown in FIG. 3A, the first light scattering layer 6A has a configuration in which light scattering particles 16A are dispersed in a binder 19A.

Particles that can be used as the light scattering particles 16A include, for example, inorganic particles such as silica, alumina, titanium oxide, and barium sulfate, organic particles such as acrylic, styrene, an acrylic/styrene copolymer, and melamine, and mixed particles in which two or more types of particles selected from these particles are mixed.

The average particle size of the light scattering particles 16A is preferably 50 nm to 1000 nm, and is more preferably 100 nm to 300 nm. Note that the particle size can be measured using an SALD-7100 (trade name; manufactured by Shimadzu Corporation).

The first surface 6a of the first light scattering layer 6A is provided with a concavo-convex shape by distributing agglomerations 17 formed by aggregating the light scattering particles 16A in lumps. Since the concavo-convex shape is formed by the agglomerations 17, the concavo-convex shape has no regularity, and pitches and depths of the concavities and convexities have variations. Regarding the size of the concavities and convexities of the first surface 6a, the difference in height of the concavity and convexity adjacent to each other is preferably about 0.2 μm to 3 μm.

The number of the particles of the agglomeration 17 forming one projection is preferably, for example, about two to ten, though it depends on the particle size distribution of the light scattering particles 16A.

In the first light scattering layer 6A, the particle density of the light scattering particles 16A preferably increases, from the first surface 6a to the boundary surface S. Note that it is preferable that the particle density of the light scattering particles 16A is lower than the particle density of light scattering particles 16B of the second light scattering layer 6B described later.

The binder 19A is formed of an appropriate transparent resin material whose refractive index is different from the refractive index of the light scattering particles 16A.

Binder matrix materials usable for the binder 19A include, for example, an ionizing radiation curing synthetic resin or thermosetting synthetic resin, such as acrylic resin, polyester resin, polycarbonate resin, styrene resin, and acrylic/styrene copolymer resin.

When ultraviolet light is used as ionizing radiation, a photopolymerization initiator is added to a coating liquid for forming a hard coat layer in which the light scattering particles 16A are mixed in a binder matrix material. Although a known photopolymerization initiator can be used, it is preferable that a photopolymerization initiator suited for the binder matrix formation material is used.

Usable photopolymerization initiators include, for example, benzoins such as benzoin, benzoin methyl ether, benzoin ethyl ether, benzoin isopropyl ether, and benzyl methyl ketal, and alkyl ethers thereof. The amount of the photopolymerization initiator used is 0.5 parts by weight or more and 20 parts by weight or less, and is preferably 1 parts by weight or more and 5 parts by weight or less.

The smoothing layer 12 is a layered part for forming a smooth joint surface 12a covering the first light scattering layer 6A and joining the light scattering layer 6A to the transparent electrode 4. The smoothing layer 12 is formed of synthetic resin having light transmissivity.

As the material for the smoothing layer 12, an appropriate resin material can be selected from the above synthetic resins suited for the binder 19A.

Note that the refractive index of the smoothing layer 12 is set to a refractive index with which the light B0 is not totally reflected from the surface 4a, or the amount of light totally reflected can be decreased. That is, if the refractive index of the smoothing layer 12 is equal to or more than the refractive index of the transparent electrode 4, or less than the refractive index of the transparent electrode 4, the refractive index of the smoothing layer 12 is approximate to the refractive index of the transparent electrode 4. If the refractive index of the smoothing layer 12 is less than the refractive index of the transparent electrode 4, the refractive index difference is preferably 0.4 or less, and is more preferably 0.2 or less.

Typically, since the refractive index of the material used for the transparent electrode 4 is often high, the refractive index of the smoothing layer 12 is increased accordingly. Hence, a configuration can be provided in which refractive index adjustment particles (labelled 106, described later) are added to the resin material similar to the binder 19A described above.

For example, as the refractive index adjustment particles, for example, one material such as zirconia, titania, potassium titanate, barium titanate, zinc oxide, and the like, or two or more of them mixed may be used. Among them, specifically, zirconia and titania are preferable because they have characteristics such as a high refractive index, good chemical stability, a high transmittance of light in the visible light range, and a particle diameter that is easily made constant.

In addition, these refractive index adjustment particles may have modified surfaces.

In addition, in the light scattering layer 6, the refractive index adjustment particles are preferably polydisperse particles whose particle diameters RH are distributed in a range of 1 nm or more and 300 nm or less. In contrast, the light scattering particles 16A are preferably monodisperse particles. Note that the dispersibility of the refractive index adjustment particles can be improved by setting the particle diameters RH in a range of 10 nm or more and 300 nm or less.

Appropriately selecting the refractive index adjustment particles having the particle diameters in the above range with considering the dispersibility can appropriately set the refractive index of the light scattering layer 6.

Here, the term "monodisperse particles" refers to a particle group whose particle size distribution is made substantially constant, and whose particle size distribution is narrow. Typically, the terms refer to that the particle sizes of the particles are within a particle size range of an average particle size, $R_A \pm R_A \times 0.5$ nm. More strictly, the particle sizes are $R_A - R_A \times 0.5$ μm≤D10, and D90≤$R_A + R_A \times 0.5$ μm.

In contrast, the term "polydisperse particles" refers to a particle group whose particle sizes are not constant, and whose particle size distribution is wider. Typically, the term refers to that the range of the particle sizes of the particles is wider than the particle size range of the average particle size $R_A \pm R_A \times 0.1$ μm. More strictly, the particle size is D10≤$R_A - R_A \times 0.1$ μm, and $R_A + R_A \times 0.1$ μm≤D90.

Note that, regarding D10 and D90, when the position indicating a fine particle size in the particle size distribution is defined as zero, and an oversize cumulative distribution that represents an upward sloping curve to the right is shown, the particle size whose cumulative value is 10% is D10, and the particle size whose cumulative value is 90% is D90.

By joining the first light scattering layer 6A to the transparent electrode 4 via the smoothing layer 12, the light B0, which has penetrated through the transparent electrode 4 and has reached the surface 4a, enters the smoothing layer 12 in a state where the light B0 does not cause total reflection substantially (including a case where the light B0 causes total reflection completely), and reaches the first surface 6a.

In addition, since the provision of the smoothing layer 12 enables formation of the transparent electrode 4 on the smooth joint surface 12a, variation in the thickness of the transparent electrode 4 can be suppressed.

For example, if the transparent electrode 4 is formed on the first surface 6a directly, variation is caused in the thickness of the transparent electrode 4 depending on the concavo-convex shape of the first surface 6a. If variation is caused in the thickness of the transparent electrode 4, problems may be caused, such as generation of uneven luminance, and generation of short-circuit current. However, the first embodiment can prevent such problems.

As shown in FIG. 3B, the second light scattering layer 6B is a layered part on which the first light scattering layer 6A is laminated via the boundary surface S and which is disposed so that the second surface 6b faces the translucent substrate 7. In the first embodiment, as shown in FIG. 2, the second light scattering layer 6B is joined to an incident side surface 7a of the translucent substrate 7 via a joint layer 14 in a state where the second light scattering layer 6B is laminated on the base material 13.

As shown in FIG. 3B, the second light scattering layer 6B has a configuration in which the light scattering particles 16B are distributed in a binder 19B.

As the light scattering particles 16B, one or more types of appropriate particulate materials can be selected from the particulate materials suited for the light scattering particles 16A described above. The type of the light scattering particles 16B may be the same as or different from that of the light scattering particles 16A.

The average particle size of the light scattering particles 16B may be similar to the average particle size of the light scattering particles 16A. Note that when the average particle size of the light scattering particles 16B is made smaller, as one method for forming a layered arrangement part 18 described later, light scattering particles 16B having an average particle size smaller than that of the light scattering particles 16A may be employed.

Hence, for example, the average particle size of the light scattering particles 16B is preferably 50 nm to 300 nm, and is more preferably 50 nm to 150 nm.

In addition, the binder 19B is formed of an appropriate transparent resin material whose refractive index is different from the refractive index of the light scattering particles 16B. Specifically, an appropriate resin material may be used by selecting it from the materials suited for the binder 19A described above, depending on the refractive index of the light scattering particles 16B. The type of the binder 19B may be the same as or different from that of the binder 19A.

As shown in FIG. 2, the base material 13 is a sheet-like member on which the light scattering layer 6 is laminated to form a sheet-like assembly 15.

As a material for the base material 13, a resin film having translucency may be employed. For example, a stretched film or an unstretched film formed of a thermoplastic resin, such as cellulose triacetate, polyester, polyamide, polyimide, polypropylene, polymethylpentene, polyvinyl chloride, polyvinyl acetal, polymethylmethacrylate, polycarbonate, or polyurethane, may be employed.

The transmittance of the base material 13 is preferably, for example, 90% or more.

As the joint layer 14, an appropriate pressure sensitive adhesive or adhesive may be employed which can join the joint layer 14 to the translucent substrate 7 and has translucency.

Materials suited for the joint layer 14 include, for example, various types of pressure sensitive adhesive and adhesive, such as acrylic, urethane, rubber-based, and silicone adhesive.

In any case, since the joint layer 14 is adjacent to the light-emitting structure 5 whose temperature becomes high, it is desirable to use a joint layer whose storage elastic modulus G' is about $1.0 \times 10^{+4}$ (Pa) or more at 100° C.

If the storage elastic modulus G' is less than the above value, a position gap may be generated between the base material 13 and the translucent substrate 7 while in use. Such a position gap may lead to a position gap between the light-emitting pixels of the light-emitting structure 5 and the light directional film 9. Such a position gap may lead to decrease of the light extraction efficiency of the light directional film 9 described later.

Note that, to stably ensure a distance between the base material 13 and the translucent substrate 7, for example, transparent fine particles such as beads may be mixed in the joint layer 14. In this case, the difference between the refractive index of the transparent fine particles and the refractive index of the material serving as the base of the joint layer 14 is preferably less than 0.01. By meeting such a condition for the refractive index difference, even when the transparent fine particles are mixed in the joint layer, scattering of light due to the refractive index difference between the fine particles and the base material of the joint layer 14 is unlikely to occur. Even when the fine particles are mixed in the joint layer, scattering of light due to the refractive index difference between the fine particles and the base material is suppressed. Hence, the transmitted light travels substantially straight in the base material 13 (including a case where the transmitted light travels completely straight). Hence, the joint layer 14 can be kept in a transparent state.

In addition, the pressure sensitive adhesive or the adhesive forming the joint layer 14 may be a double-sided tape, or may be formed in a single layer.

In addition, the refractive indexes of the base material 13, the joint layer 14, and the translucent substrate 7 are preferably substantially equal to each other (including a case where the refractive indexes are completely equal to each other) so that total reflection is unlikely to occur at each interface (the interface between the base material 13 and the joint layer 14, and the interface between the joint layer 14 and the translucent substrate 7). The refractive indexes of the base material 13, the joint layer 14, and the translucent substrate 7 are preferably set so that, for example, the refractive index difference between the adjacent members is 0.1 or less.

The second light scattering layer 6B has a configuration in which the light B0, which enters the first light scattering layer 6A through the transparent electrode 4 and travels therethrough while being scattered, is easily outputted as light B2 toward the translucent substrate 7, while being scattered, through the base material 13, and light B3, which enters the second light scattering layer 6B from the translucent substrate 7 through the base material 13 is easily reflected toward the translucent substrate 7 as in the case of light B4.

Specifically, the second light scattering layer 6B is configured so that the particle density of the light scattering particles 16B in the second light scattering layer 6B is equal to or more than the particle density of the first light scattering layer 6A, and the particle density of the second light scattering layer 6B becomes the highest at the second surface 6b adjacent to the incident side surface 13a of the base material 13.

Hence, on the second surface 6b of the second light scattering layer 6B, the light scattering particles 16B in a dense state are arranged across the incident side surface 13a of the base material 13, which is a surface smoother than the concavo-convex shape of the first surface 6a, and the layered arrangement part 18 is formed in the vicinity of the incident side surface 13a. In the layered arrangement part 18, since the light scattering particles 16B are arranged densely, most incident light passes through the light scattering particles 16B.

In contrast, an area of the second light scattering layer 6B between the layered arrangement part 18 and the boundary surface S has a particle density of the light scattering particles 16B lower than that of the layered arrangement part 18. Among the light scattering particles 16B, gaps are formed which are filled with the binder 19B.

As described above, in the EL element 10 according to the first embodiment, between the counter substrate 1 and the translucent substrate 7, the counter electrode 2, the light-emitting layer 3, the transparent electrode 4, the first light scattering layer 6A, the second light scattering layer 6B, the base material 13, and the joint layer 14 are laminated in this order from the counter substrate 1.

As shown in FIG. 1, in the El element 10 according to the first embodiment, the light directional film 9 is joined to an emission side surface 7b of the translucent substrate 7 opposed to the incident side surface 7a via a joining layer 8.

The light directional film 9 is an optical sheet that has a concavo-convex shape provided to a surface thereon to emit light, which has been generated from the light-emitting structure 5 and has penetrated through the translucent substrate 7, and imparts directivity to the light, by which the light is mainly directed toward the front direction normal to the translucent substrate 7.

In the light directional film 9, on one surface of a base material part 9A formed of a sheet-like translucent material, a light directional structural layer part 9B having a concavo-convex shape is provided.

For the base material part 9A, various materials may be used which have light transmissivity for the wavelength of the light B0 emitted from the light-emitting layer 3. For example, a synthetic resin material for optical components or the like may be used.

Examples of the above synthetic resin material may include thermoplastic resins such as, polyester resin, acrylic resin, polycarbonate resin, polystyrene resin, MS (copolymer of acrylic and styrene) resin, polymethylpentene resin, and cycloolefin polymer.

Other examples can include ionizing radiation curable resins composed of an oligomer or acrylate such as polyester acrylate, urethane acrylate, and epoxy acrylate.

The light directional structural layer part 9B has a configuration in which unit prism lenses 9b, whose polygonal cross section is extended in one direction, are arranged on the surface of the base material part 9A and in two axial directions so as to be crossed with each other.

Hence, the surface shape of the light directional structural layer part 9B is formed by combining a plurality of flat surfaces 9a with each other. When the light directional structural layer part 9B is formed (processed), curved surfaces having a minute round are formed on the top part of the light directional structural layer part 9B. The light directional structural layer part 9B has no curved surfaces on the portions other than the curved surfaces formed on the top parts.

As described above, by providing the flat surfaces 9a instead of the curved surfaces on the light directional structural layer part 9B, angular dependence of the transmittance of the light penetrating through the light directional structural layer part 9B and the reflectance of the light reflected from the light directional structural layer part 9B with respect to the incident angle can be increased. Hence, since the angle of the light penetrating through the light directional structural layer part 9B is decreased, the directivity of the light can be increased.

Note that although the two axial directions in which the unit prism lenses 9b are arranged are not specifically limited, the intersection angle of the two axial directions is preferably 80° or more and 90° or less. As an example, the intersection angle is set to 90°. Since FIG. 1 is a sectional view, the unit prism lenses 9b arranged in the horizontal direction as viewed in the figure are shown, and the unit prism lenses 9b arranged in the depth direction of the paper are not shown.

An example of the cross-sectional shape of the unit prism lens 9b is shown as an example of polygonal cross sections. In the example, the cross-sectional shape is formed in an isosceles triangle shape in which the flat surfaces 9a form an apex angle θ. The apex angle θ is preferably 80° or more and 100° or less.

Note that, in order to increase the light redistribution effect of the light directional structural layer part 9B and to increase the directivity of the light B1 emitted from the light directional film 9, it is preferable that the apex angles θ of the respective unit prism lenses 9b in the two axial directions are set to be the same. In this case, light scattering is suppressed from the prism positioned in the angular direction where the directivity is lower.

The heights of the unit prism lenses 9b may be all the same, or may be appropriately varied.

As the material of the light directional structural layer part 9B, the same material as that of the base material part 9A may be employed.

The light directional film 9 having the above configuration can be shaped, for example, by pouring the above material into a previously formed mold to solidify the material. This mold can be manufactured by using a diamond bite having a shape similar to the cross-sectional shape of the unit prism lenses 9b to cut a mold base material, which has been subject to copper plating, so as to have concave shapes corresponding to the outer shape of the unit prism lenses 9b.

In addition, the light directional film 9 may be shaped by, in addition to the above shaping method using pouring and solidification, extrusion molding or injection molding using thermoplastic resin, or, for example, an ionizing radiation molding method using an ionizing radiation curable resin such as ultraviolet curing resin. In this case, the shapes of the base material part 9A and the light directional structural layer part 9B may be integrally molded, or may be separately molded so as to be thereafter assembled.

In addition, in any case, the light directional film 9 may be molded by dispersing a diffusing agent such as filler, which provides a light diffusion function for the material forming the light directional film 9.

Furthermore, conductive particles of antimony-containing tin oxide (ATO) or ultrafine particles of indium tin oxide (ITO) or the like may be dispersed as an antistatic agent.

Dispersing the antistatic agent can increase an antifouling property of the light directional film 9.

In the light directional film 9, for example, when the light directional structural layer part 9B is shaped on the base material part 9A by the ionizing radiation molding method or the like, for example, a stretched or an unstretched transparent film formed of thermoplastic resin such as cellulose triacetate, polyester, polyamide, polyimide, polypropylene, polymethylpentene, polyvinyl chloride, polyvinyl acetal, polymethylmethacrylate, polycarbonate, or polyurethane may be used.

In this case, the thickness of the base material part 9A is preferably 50 µm to 300 µm depending on the characteristics of the used material such as stiffness, from the standpoint of workability and handling.

As the joining layer 8 joining the above light directional film 9 to the emission side surface 7b, an appropriate pressure sensitive adhesive or adhesive having translucency may be employed.

As the material of the joining layer 8, a material similar to that of the joint layer 14 described above may be used. As the configuration of the joining layer 8, a configuration similar to that of the joint layer 14 described above may be employed. Note that the material and the configuration of the joining layer 8 are not required to be exactly the same as those of the joint layer 14. For example, a material and a configuration different from those of the joint layer 14 can be appropriately selected from the materials and configurations described above depending on the difference between the materials of objects to be joined, the difference between temperature conditions when used, or the like.

It is especially important for the joining layer 8 that the light emitted from the emission side surface 7b of the translucent substrate 7 is allowed to enter the light directional film 9 keeping the emission angle distribution thereof, to limit the directivity determined by the light directional film 9 within a predetermined range.

Hence, it is particularly preferable that, in the configuration of the joining layer 8, a stable thickness is ensured, and the configuration has transparency so that scattering of the transmitted light by the joining layer 8 is suppressed. Specifically, for example, a configuration is particularly preferable in which fine particles such as beads, which have a refractive index having a small difference from that of the base material of the joining layer 8, are mixed in the joining layer 8. In addition, it is preferable that the value of the refractive index of the joining layer 8 is between the refractive index of the light directional film 9 and the refractive index of the translucent substrate 7, because the reflections from respective interfaces (the interface between the joining layer 8 and the translucent substrate 7, and the interface between the joining layer 8 and the light directional film 9) can be suppressed.

The above EL element 10 is prepared by, for example, sticking the assembly 15 to the incident side surface 7a of the translucent substrate 7 via the joint layer 14, providing the smoothing layer 12 to the first surface 6a of the light scattering layer 6, and then forming the light-emitting structure 5 on the smoothing layer 12.

Then, the counter substrate 1 is stuck on the light-emitting structure 5. Next, the light directional film 9 shaped as described above is stuck on the incident side surface 7a of the translucent substrate 7 via the joining layer 8.

Hereinafter, a method of preparing the assembly 15 is described in detail.

Figure 4A:
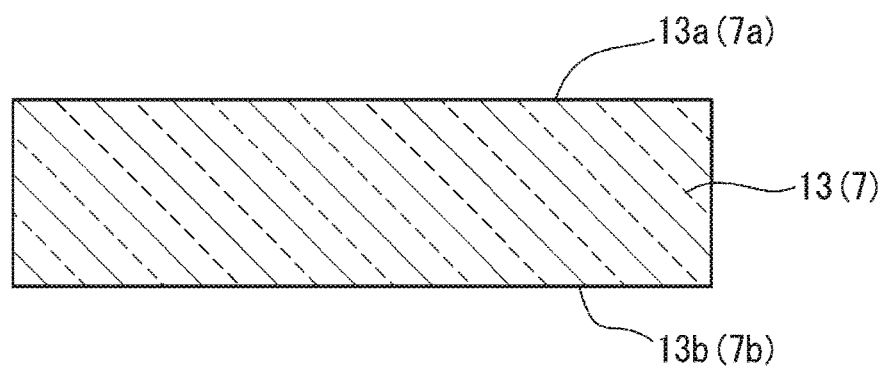
FIG. 4A is a process explanatory drawing schematically showing an example of a process for preparing the EL element according to the first embodiment of the present invention.
Figure 4B:
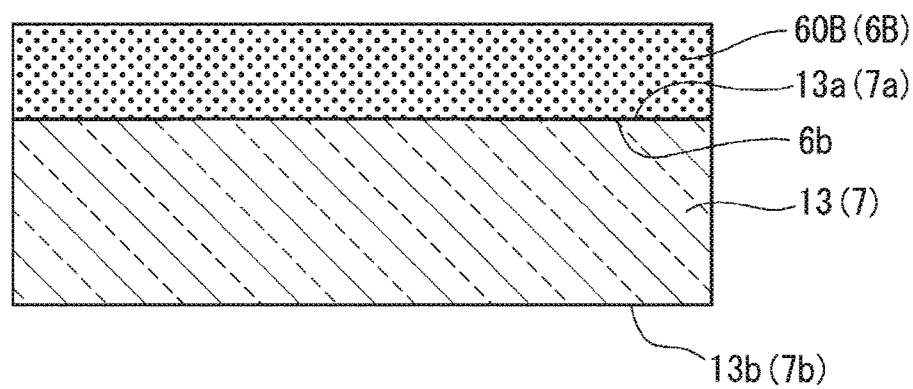
FIG. 4B is a process explanatory drawing schematically showing the example of the process for preparing the EL element according to the first embodiment of the present invention.
Figure 4C:
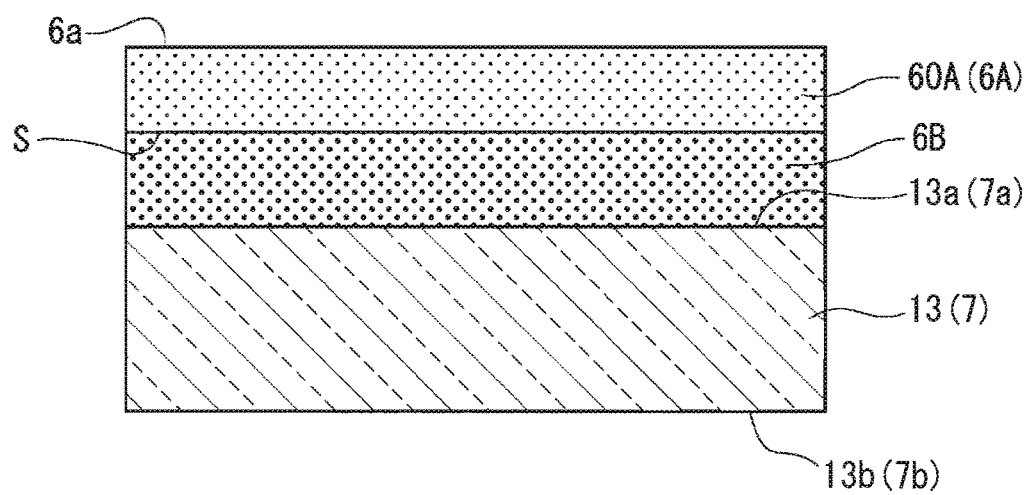
FIG. 4C is a process explanatory drawing schematically showing the example of the process for preparing the EL element according to the first embodiment of the present invention.

FIG. 4A, FIG. 4B, and FIG. 4C are process explanatory drawings schematically showing an example of a process for preparing the EL element according to the first embodiment of the present invention First, as shown in FIG. 4A, the base material 13 is formed. Both the incident side surface 13a and an emission side surface 13b of the base material 13 are flat surfaces.

In this case, the joint layer 14, not shown, may be previously coated onto the emission side surface 13b, or may be coated after the light scattering layer 6 described later is formed.

Next, a light scattering particle coating liquid 60B is applied to the incident side surface 13a to form the second light scattering layer 6B (refer to FIG. 4B).

The application method may be appropriately selected from known application methods, for example, spin coating, die coating, curtain coating, and the like.

In the light scattering particle coating liquid 60B, the light scattering particles 16B are mixed in the uncured binder 19B so that a desired particle density can be obtained. In the second light scattering layer 6B, the light scattering particles 16B are to be arranged at least across the incident side surface 13a.

Since the light scattering particles 16B tend to settle in the binder 19B, the above configuration of the second light scattering layer 6B is naturally formed to some extent.

To reliably form the second light scattering layer 6B having the above configuration, for example, the light scattering particle coating liquid 60B may be used which includes the light scattering particles 16B having minute particle diameters in high concentration. In this case, in the process of mixing the binder 19B with the light scattering particles 16B, the light scattering particles 16B having smaller particle diameters enter into gaps between the light scattering particles 16B having larger particle diameters. Hence, the light scattering particles 16B are easily arranged in the vicinity of the incident side surface 13a.

For example, when the light scattering particles 16B are titanium oxide, and the binder 19B is acrylic, it is preferable that the light scattering particle coating liquid 60B, in which the titanium oxide having particle sizes less than 100 nm is included in the acrylic, the titanium oxide being 50 wt %, is applied so as to have a thickness of 0.5 µm to 1 µm.

In addition, when the particle sizes of the light scattering particles 16B are larger, the settling effect of their own weight increases. Hence, the concentration of the light scattering particles 16B in the light scattering particle coating liquid 60B may be set lower.

For example, in a case of a material and an application thickness similar to those described above, a preferable light scattering particle coating liquid 60B is one in which the titanium oxide having particle sizes of about 100 nm is included in the acrylic, the titanium oxide being 50 wt %.

After the light scattering particle coating liquid 60B is applied, and thereafter the second light scattering layer 6B is formed by drying and curing the light scattering particle coating liquid 60B, as shown in FIG. 4C, a light scattering particle coating liquid 60A is applied to the upper surface of the second light scattering layer 6B serving as the boundary surface S to form the first light scattering layer 6A.

As the application method, a method similar to the method of applying the light scattering particle coating liquid 60B may be employed.

In the light scattering particle coating liquid 60A, the light scattering particles 16A are mixed in the uncured binder 19A so that a desired particle density can be obtained. In the first light scattering layer 6A, the concavo-convex shape formed of the agglomerations 17 are required to be provided to at least the first surface 6a.

The above configuration is naturally formed to some extent when the binder 19A includes the light scattering particles 16A composed of fine particles of low concentration.

To more reliably form the appropriate concavo-convex shape, for example, a light scattering particle coating liquid 60A may be used which includes the light scattering particles 16A, which have larger particle sizes, at high concentration. In this case, since the diameter of agglomeration 17, which is formed by the agglomeration occurring in the process of mixing the binder 19A with the light scattering particles 16A, becomes larger, a desirable concavo-convex shape of about 0.2 µm to 0.8 µm is easily obtained.

For example, when the light scattering particles 16B are titanium oxide, and the binder 19B is acrylic, it is preferable that the light scattering particle coating liquid 60A, in which the titanium oxide having particle sizes more than 100 nm is included in acrylic, the titanium oxide being 30 wt %, is applied to the second light scattering layer 6B so as to have the thickness of 0.5 µm to 1 µm.

In addition, when the particle sizes of the light scattering particles 16A are not so large, the concentration of the light scattering particle coating liquid 60A may be set so that the light scattering particles 16A are easily aggregated in lumps appropriately.

For example, in a case of the material and the application thickness similar to those described above, a preferable light scattering particle coating liquid 60A is one in which the titanium oxide having particle sizes of about 100 nm is included in acrylic, the titanium oxide being 20 wt %.

When the light scattering particle coating liquid 60A is applied, and thereafter the light scattering particle coating liquid 60A is dried and cured, the binder 19A shrinks, so that the agglomerations 17 are exposed at the surface of the binder 19A, whereby the first light scattering layer 6A can be obtained which is provided with the first surface 6a having a concavo-convex shape.

The above first light scattering layer 6A is in a condition in which the light scattering particles 16A also aggregate inside the first light scattering layer 6A, and the binder 19A is filled in the spaced agglomerations 17.

Thus, the light scattering layer 6 is formed on the base material 13. Note that if the joint layer 14 was not previously coated onto the base material 13, the joint layer 14 is coated.

Thus, the assembly 15 is prepared.

When the above assembly 15 is previously prepared, for example, as a continuous sheet or the like, and the element 10 is prepared, the assembly 15 can be cut to a desired size and can be adhered. Hence, the production efficiency increases, which is desirable.

Next, operational effects of the EL element 10 are described.

As shown in FIG. 1, the light B0 generated from the light-emitting layer 3 reaches the surface 4a of the transparent electrode 4.

The light B0 has a predetermined light distribution because the light B0 is radiated in various directions from the light-emitting layer 3.

In the first embodiment, as shown in FIG. 2, the smoothing layer 12 is provided which contacts the surface 4a and has a refractive index close to the refractive index of the transparent electrode 4 (including the case where the refractive indexes agree with each other).

Hence, the light B0 travels substantially straight through the path (including a case where the light B0 travels completely straight) and enters the smoothing layer 12 in a state where the light B0 does not cause total reflection substantially from the surface 4a (including a case where the light B0 does not at all causes total reflection). Then, the light B travels substantially straight and reaches the first surface 6a.

Hence, the light B0 travels in the smoothing layer 12 in a state where the light distribution thereof substantially does not change, and reaches the first surface 6a.

As shown in FIG. 3A, since the first surface 6a is provided with the concavo-convex shape by the agglomerations 17 of the light scattering particles 16A, the light returning toward the smoothing layer 12 side is reduced. The light B0 effectively enters the inside of the first light scattering layer 6A.

That is, since the light scattered by the light scattering particles 16A and returning to the inside of the smoothing layer 12 is thoroughly emitted from the surface of the agglomerations 17 to the outside, the light scattered from the lateral sides of the projections re-enters the projections of the adjacent agglomerations 17 without traveling toward the transparent electrode 4.

In contrast, for example, when the light scattering particles 16A are configured so as to be dense, and are arranged on the plane on the first surface 6a, such light scattering particles 16A function as a scattering reflective surface. Hence, all the scattering light emitted toward the smoothing layer 12 once enters the smoothing layer 12 and travels toward the transparent electrode 4. Hence, compared with a case where the first surface 6a is provided with concavo-convex shape, the probability that the scattering light re-enters the light scattering layer decreases.

In addition, when the first surface 6a is formed as a flat surface formed of only the binder 19A, the smoothing layer 12 has a refractive index higher than the refractive index of the binder 19A. Hence, total reflection occurs depending on the angle of incidence of the light B0. Hence, the amount of light returning to the smoothing layer 12 becomes larger.

According to the first surface 6a as described in the first embodiment, since the generation of the returning light described above is suppressed by the concavo-convex shape, the light B0 effectively enters the first light scattering layer 6A.

The light B having entered the first light scattering layer 6A is scattered by the light scattering particles 16A, and reaches the second light scattering layer 6B while changing the traveling direction thereof.

Since the light B0 is scattered by the light scattering particles 16B in the second light scattering layer 6B and travels in various directions while being deflected, the traveling direction of the light is diversified as a whole.

Then, as shown in FIG. 3B, the light B0 enters the translucent substrate 7 from the second surface 6b as the light B2, which is radiated in a range wider than the light distribution at the incident side.

As shown in FIG. 1, of the light B2 having entered the translucent substrate 7, diagonally traveling light B2', for example, travels substantially straight through the translucent substrate 7, the joining layer 8, and the light directional film 9, and reaches the flat surface 9a of the unit prism lens 9b.

Since the flat surface 9a is inclined with respect to the emission side surface 7b, the light B2' is refracted depending on the angle of incidence with respect to the flat surface 9a, and is emitted as light B5, which is deflected in a direction close to the front direction of the EL element 10.

Meanwhile, of the light B2, light B2″ which is radiated from the incident side surface 7a in a direction close to the perpendicular direction, is totally reflected from a pair of flat surfaces 9a. Hence, the light B2″ returns to the incident side surface 7a at substantially the same angle as in the case of light B3.

In a case where the light scattering layer 6 is not provided, after the light B3 having returned as described above is emitted from the translucent substrate 7, the light B3 directly enters the transparent electrode 4 and is attenuated inside the light-emitting structure 5.

However, in the first embodiment, as shown in FIG. 3B, the second light scattering layer 6B is provided via the base material 13. Hence, the light B3 traveling from the incident side surface 7a toward the transparent electrode 4 side penetrates the base material 13 and reaches the second surface 6b of the second light scattering layer 6B.

On the second surface 6b, the layered arrangement part 18 is formed which is arranged densely across the flat incident side surface 13a to function as a scattering reflective surface for the light B0. Hence, the light B3 is scattered and reflected as with light B4, and becomes light traveling toward the light directional film 9 as in the case of the light B2. At this time, since the light B4 has a light distribution due to the scattering and reflection, most of the light B4 is reflected in a direction in which the light B4 is not totally reflected by the flat surfaces 9a. As a result, when the light B4 reaches the flat surfaces 9a, the light B4 is reflected to the outside depending on an incident angle distribution thereof.

That is, in the EL element 10, since the light B0 having penetrated through the transparent electrode 4 penetrates the light scattering layer 6 while being scattered by the light scattering layer 6, light components emitted from the light directional film 9 to the outside increase compared with a case where the light scattering layer 6 is not provided, as in the case of the light B2′.

In addition, for example, as in the case of the light B2″, even when light is totally reflected from the flat surfaces 9a of the unit prism lens 9b, the second light scattering layer 6B of the light scattering layer 6 includes the layered arrangement part 18 (refer to FIG. 3B). Hence, as indicated by hollow arrows in FIG. 1, the light B0 repeats reflection between the unit prism lens 9b and the layered arrangement part 18, and is scattered and reflected from the layered arrangement part 18, whereby the components emitted to the outside gradually increases as in the case of the light B2′.

Hence, as in the case where the layered arrangement part 18 is not provided, the components which are included in the light B3 returning to the transparent electrode 4 are reduced, which would otherwise lead to loss of the amount of light.

As described above, in the EL element 10, since the light scattering layer 6 is provided in which the arrangement of the light scattering particles differs between the first surface 6a facing the transparent electrode 4 and the second surface 6b facing the translucent substrate 7, the light extraction efficiency can be improved.

In addition, since the liquid crystal display device 50 includes the above EL element 10, the power consumption of the EL element 10 for obtaining a desired luminance is reduced, which saves power used by the device.

(Modification)

Next, a modification of the EL element according to the first embodiment is described.

Figure 5:
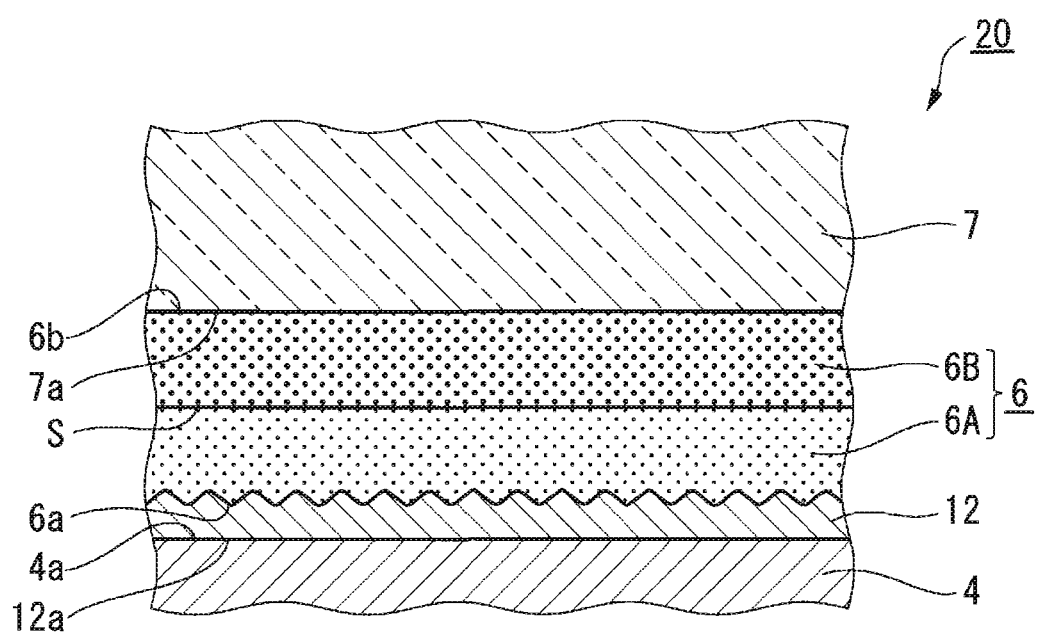
FIG. 5 is a sectional view schematically showing a configuration of an essential part of a modification of the EL element according to the first embodiment of the present invention.

FIG. 5 is a sectional view schematically showing a configuration of an essential part of the modification of the EL element according to the first embodiment of the present invention.

In an EL element 20 of the present modification, the base material 13 and the joint layer 14 of the EL element 10 of the above first embodiment are eliminated, and the second surface 6b of the light scattering layer 6 is formed on the incident side surface 7a of the translucent substrate 7.

The EL element 20 may be used as a lighting device in the liquid crystal display device 50 instead of the EL element 10 according to the first embodiment.

Hereinafter, the points different from those of the above first embodiment are mainly described.

As shown in FIG. 4B and FIG. 4C, the above EL element 20 may be prepared in the same way as the first embodiment, except that the second light scattering layer 6B is formed on the incident side surface 7a of the translucent substrate 7, and thereafter the first light scattering layer 6A is formed in the same way as the first embodiment.

According to the EL element 20, since the light scattering layer 6 similar to that of the first embodiment is provided between the transparent electrode 4 and the translucent substrate 7, the light extraction efficiency can be improved as in the case of the first embodiment.

In this case, in the present modification, the base material 13 and the joint layer 14 are eliminated. Hence, since the loss of the amount of light due to reflection and absorption thereby is eliminated, the light extraction efficiency can be further improved compared with the first embodiment.

In addition, since the base material 13 and the joint layer 14 can be eliminated, the manufacturing cost can be further reduced.

Note that, in the descriptions of the first embodiment and the modification, examples are described in which the smooth joint surface 12a covering the first surface 6a of the first light scattering layer 6A is formed. However, the smoothing layer 12 can be eliminated when the transparent electrode 4 having a thickness by which uneven luminance, short circuit, and the like are not generated can be formed without providing the smoothing layer 12.

In the descriptions of the first embodiment and the modification, examples are described in which the light scattering layer 6 is configured by two layers of the first light scattering layer 6A and the second light scattering layer 6B. However, if the layered arrangement part 18 or the first surface 6a having a concavo-convex shape can be formed, the light scattering layer 6 may have a single layer structure in which the arrangement of the light scattering particles or the particle density change within the constant layer thickness. Alternatively, a multilayer structure having three or more layers may be provided.

In the descriptions of the first embodiment and the modification, examples are described in which the EL elements 10 and 20 serve as a lighting device which is used by being disposed on the back surface of the image display element of the liquid crystal display device 50. However, the EL elements 10 and 20 can be used as a lighting device that illuminates an object other than the image display element.

In addition, since the EL elements 10 and 20 can be subject to pixel driving, the EL elements 10 and 20 can be also used as display devices displaying, for example, images, character information, picture patterns, and the like by causing each light-emitting pixel to emit light based on image signals.

The first embodiment and the modification have been described by way of examples in which a plurality of pixels, which can be individually driven, configure the light-emitting pixels of the EL elements 10 and 20. However, it is not essential that the pixels are driven, depending on the use for lighting.

For example, a surface-emitting light source can be configured by simultaneously driving the light-emitting layers.

In the descriptions of the first embodiment and the modification, the examples are described in which the unit prism lens 9b of the light directional structural layer part 9B is a prism lens having a cross section having a polygonal shape such as a triangular shape. However, the unit prism lens 9b may be a polygonal pyramid-shaped prism lens.

In addition, other than the concavo-convex shape of the light directional structural layer part 9B described above, various known concavo-convex shapes may be employed. For example, the light directional structural layer part 9B may not have the unit prism lenses, and may be formed with a plurality of concavo-convex shapes having different sizes and shapes.

Any of the elements described in the above first embodiment and modification may be implemented by being appropriately combined with each other or eliminated within the technical ideas of the present invention.

Second Embodiment

Hereinafter, the second embodiment of the present invention is described with reference to the accompanying drawings.

First, an EL element substrate, the EL element, a lighting device, and a liquid crystal display device according to the second embodiment of the present invention are described.

Figure 6A:
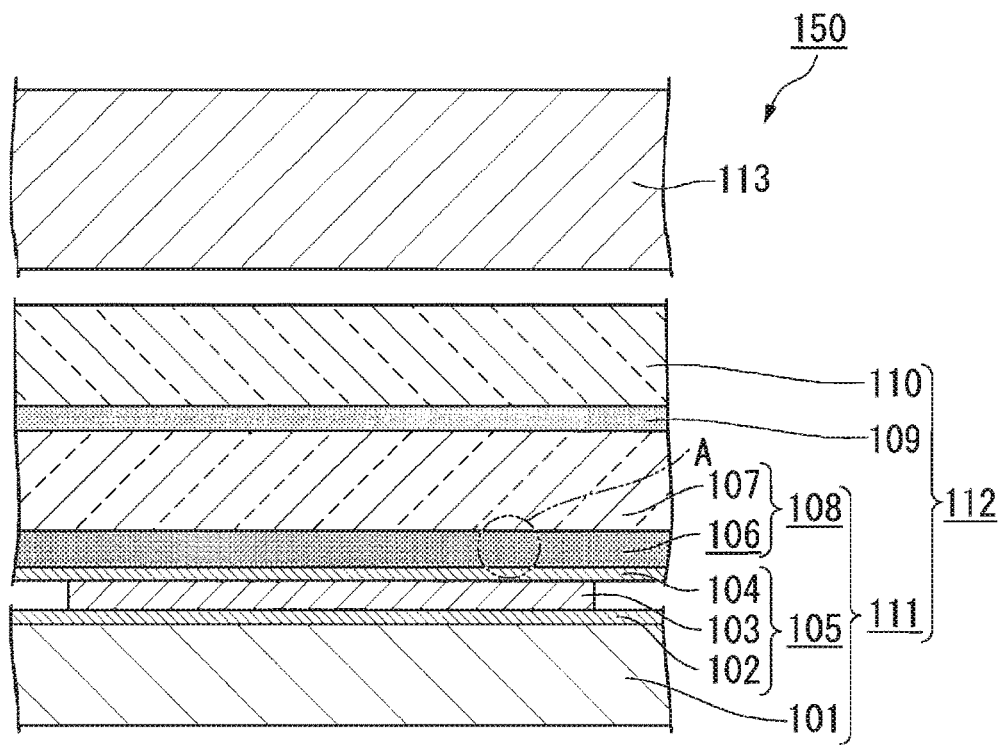
FIG. 6A is a sectional view schematically showing a configuration of a liquid crystal display device according to a second embodiment of the present invention.
Figure 6B:
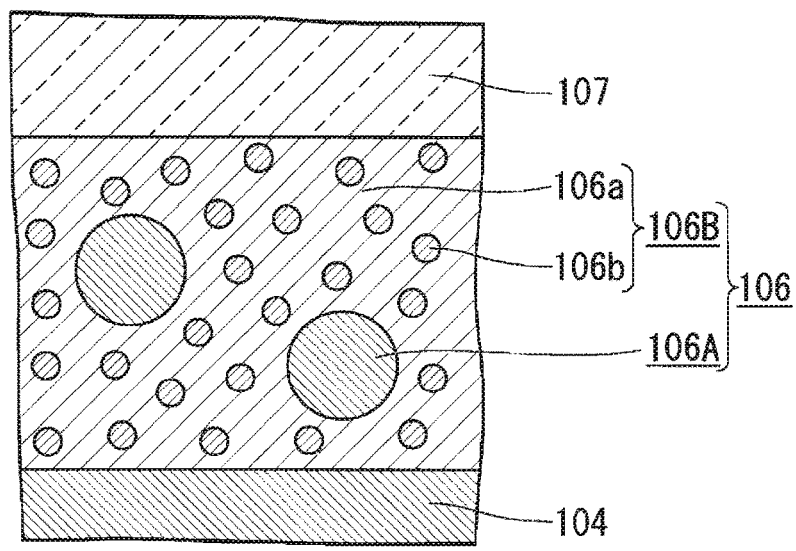
FIG. 6B is a sectional view schematically showing the configuration of the liquid crystal display device according to the second embodiment of the present invention, which is an enlarged view schematically showing a portion A of FIG. 6A.

FIG. 6A is a sectional view schematically showing a configuration of the liquid crystal display device according to the second embodiment of the present invention. FIG. 6B is an enlarged view schematically showing a portion A of FIG. 6A.

Note that, in the drawings used for the following descriptions, the scale of each member is appropriately changed so that each member is set to a recognizable size.

As shown in FIG. 6A, a liquid crystal display device 150 according to the second embodiment includes a liquid crystal panel 113 (image display element using liquid crystals) and a lighting device 112 according to the second embodiment.

The liquid crystal panel 113 is an image display element, which drives liquid-crystal shutters corresponding to pixels based on an image signal received from a signal source, not shown, to control transmitted light, thereby displaying an image.

The lighting device 112 is disposed on a back surface of the liquid crystal panel 113. The lighting device 112 is a part of the device configuring a backlight supplying illumination light illuminating the liquid crystal panel 113. In the second embodiment, the lighting device 112 has a plurality of pixels which can individually emit light. These pixels are driven based on a control signal such as an image signal transmitted from a drive part, not shown, whereby the driven pixels emit light.

According to the above pixel driving, for example, the lighting device 112 can change the lighting range and can change the color of the illumination light based on the control signal.

The essential part of the lighting device 112 includes an EL element 111 and a glass substrate 110, which are laminated in this order.

The EL element 111 is a part of the device configuring an illumination light source in the lighting device 112. The EL element 111 has a configuration in which a counter substrate 101, a light-emitting structure 105, and an EL element substrate 108 are laminated in this order from the opposite side of the glass substrate 110.

The counter substrate 101 is disposed so as to be opposed to the EL element substrate 108 described later. The counter substrate 101 is a plate-like or sheet-like member. The light-emitting structure 105 described later is sandwiched between the counter substrate 101 and the EL element substrate 108.

The material of the counter substrate 101 is not specifically limited, if the material has appropriate mechanical strength enough to support the light-emitting structure 105, and can protect the light-emitting structure 105 from, for example, moisture, outside air, and the like.

Examples of the material which can be suitably used for the counter substrate 101 include films made of polyethylene terephthalate (PET), triacetyl cellulose (TAC), diacetylcellulose, acetyl cellulose butyrate, polyethylene naphthalate (PEN), cyclo-olefin polymer, polyimide, polyether sulfone (PES), polymethylmethacrylate (PMMA), and polycarbonate (PC).

These materials are preferable in that they have appropriate mechanical strength and appropriate refractive indexes.

In addition, the counter substrate 101 is preferably provided with a light reflection layer, which reflects the light generated from the light-emitting structure 105 toward the EL element substrate 108, on any of the surfaces perpendicular to the thickness direction.

In addition, the counter substrate 101 can be formed of a metallic material having light reflectivity. In this case, the counter substrate 101 itself configures the light reflection layer.

The light-emitting structure 105 includes a counter electrode 102 disposed on the counter substrate 101, a transparent electrode 104 disposed on the surface of the EL element substrate 108 opposed to the counter substrate 101, and a light-emitting layer 103 sandwiched between the counter electrode 102 and the transparent electrode 104.

In the light-emitting structure 105, by applying voltage across the transparent electrode 104 and the counter electrode 102 configuring an electrode pair, the light-emitting layer 103 causes EL light emission. As the configuration of the light-emitting structure 105, various conventionally-known configurations may be employed.

Polarities of the counter electrode 102 and the transparent electrode 104 are not specifically limited. However, in the second embodiment, since the light generated from the light-emitting layer 103 is emitted toward the EL element substrate 108, at least the transparent electrode 104 is required to be an electrode having good translucency.

Examples of the material suited to the transparent electrode 104 include, for example, ITO (Indium tin oxide, refractive index of 1.7 to 2.3), IZO (registered trademark, Indium zinc, refractive index of 1.9 to 2.4). When ITO is used as the material of the transparent electrode 104, the transparent electrode 104 preferably serves as positive electrode.

Note that when numerical examples of physical quantities such as a refractive index and a transmittance, which depends on a measurement wavelength, are cited herein, the physical quantity with respect to a wavelength of 550 nm is given, unless otherwise specified.

Since the presence or absence and the extent of translucency of the counter electrode 102 are not important, the material of the counter electrode 102 may be an appropriate metallic material having good electrical conductivity, for example, aluminum, silver, copper, and the like.

To increase the amount of light travelling toward the EL element substrate 108, the material of the counter electrode 102 preferably has a higher reflectance. Note that when the counter substrate 101 has good light reflectivity, or the counter substrate 101 is provided with a light reflection layer, the material of the counter electrode 102 can be similar to that of the transparent electrode 104.

The light-emitting layer 103 may be, for example, a white light light-emitting layer. In this case, a configuration may be employed in which the transparent electrode 104 is formed of ITO, and the counter electrode 2 is formed of aluminum. In the configuration, from the transparent electrode 104 to the counter electrode 102, CuPc (copper phthalocyanine)/α-NPD doped with 1% rubrene/dioctyl anthracene doped with 1% perylene/Alq3/lithium fluoride are laminated in this order.

However, the configuration of the light-emitting layer 103 is not limited to this. Any configuration can be employed which uses an appropriate material that can set the wavelengths of light rays emitted from light-emitting layer 103 to wavelengths corresponding to R (red), G (green), and B (blue).

In addition, in the second embodiment, since the lighting device 112 is subject to pixel driving, the light-emitting structure 105 is formed so as to correspond to the pixels, and the transparent electrode 104 and the counter electrode 102 of each of the pixels are connected to a drive part, not shown, by wires. That is, although only the configuration of one pixel is shown in FIG. 6A, a plurality of light-emitting structures 105 configuring other pixels are arranged between the counter substrate 101 and the EL element substrate 108 so as to be adjacent to the light-emitting structure 105 shown in FIG. 6A.

Although the arrangement pattern of the plurality of light-emitting structures 105 is not specifically limited, for example, the arrangement pattern may have a rectangular lattice shape in a planar view.

The EL element substrate 108 is a translucent plate-like member that covers the light-emitting structure 105 from the opposite side of the counter substrate 101 to protect the light-emitting structure 105 and to extract the light generated from the light-emitting layer 103 which has penetrated through the transparent electrode 104, to the outside.

In the second embodiment, the EL element substrate 108 includes a translucent substrate 107, which has a refractive index $n_T$ lower than a refractive index $n_E$ of the transparent electrode 104, and a light scattering layer 106, which is formed by being laminated on the translucent substrate 107 and is arranged so as to be intimately in contact with the surface of the transparent electrode 104 opposed to the light-emitting layer 103.

The light scattering layer 106 makes the total reflection difficult to occur from the interface between the light scattering layer 106 and the transparent electrode 104, and makes the total reflection difficult to occur from the interface between the light scattering layer 106 and the translucent substrate 107. Hence, the light scattering layer 106 is a layered part having light transmissivity to improve the light transmittance of the light generated in the light-emitting structure 105 and penetrating from the transparent electrode 104 to the translucent substrate 107.

As schematically shown in FIG. 6B, the light scattering layer 106 includes a base material part 106B and scattering particles 106A.

The base material part 106B is a part in which refractive index adjusting particles 106b having light transmissivity and a binder 106a are combined with each other, whereby the refractive index is adjusted to a constant value $n_{BH}$.

The value of the refractive index $n_{BH}$ is set to an appropriate value so that the light generated from the light-emitting structure 105 becomes difficult to be totally reflected (including a case where the light is not totally reflected) from at least one of the interface between the light scattering layer 106 and the transparent electrode 104 and the interface between the light scattering layer 106 and the translucent substrate 107.

Note that although the total reflection does not occur from the interface of the translucent substrate 107 if the refractive index $n_{BH}$ is equal to or less than the refractive index $n_T$, the total reflection easily occurs from the interface between the light scattering layer 106 and the transparent electrode 104 compared with a case where the light scattering layer 106 is not provided.

Hence, the refractive index $n_{BH}$ is required to be at least higher than the refractive index of the translucent substrate 107.

For example, the refractive index $n_{BH}$ can be set to a value intermediate between the refractive index $n_E$ and of the transparent electrode 104 and the refractive index $n_T$ of the translucent substrate 107.

Specifically, for example, if the refractive index $n_T$ of the translucent substrate 107 is 1.60, and the transparent electrode 104 is ITO of $n_E$=1.90, $n_{BH}$ is preferably more than 1.60 and less than 1.90 and is more preferably 1.70 or more and less than 1.90.

Note that, in the second embodiment, the total reflection from the interface between the light scattering layer 106 and the translucent substrate 107 is reduced by the effect of the scattering particles 106A described later, compared with a case where the scattering particles 106A are not provided. Hence, the refractive index difference ($n_E$−$n_{BH}$) is preferably smaller so that the refractive index $n_{BH}$ is close to the refractive index $n_E$ of the transparent electrode 104. For example, the refractive index difference ($n_E$−$n_{BH}$) is preferably within a range of more than 0 and 0.15 or less.

The materials of the binder 106a and the refractive index adjusting particles 106b are not specifically limited on condition that a layered part having an index difference of $n_{BH}$ can be formed. Note that, to form the base material part 106B at low cost, it is preferable that a low refractive index material is employed as the binder 106a, and the blending amount of the refractive index adjusting particles 106b composed of the material having a higher refractive index is adjusted to adjust the index difference of $n_{BH}$.

Examples of the material suited to the binder 106a include both Ionizing radiation curing resin and thermoset resin. The types of resin material include, for example, acrylic resin, polyester resin, polycarbonate resin, styrene resin, and acrylic/styrene copolymer resin.

To cure the above resin, when ultraviolet light is used as ionizing radiation, photopolymerization initiator is added to a coating liquid for forming a hard coat layer.

Although a known photopolymerization initiator may be used, it is preferable that a photopolymerization initiator suited for the material forming the binder 106a (hereinafter, binder matrix formation material) is used. As the photopolymerization initiator, for example, a benzoin such as benzoin, benzoin methyl ether, benzoin ethyl ether, benzoin isopropyl ether, and benzyl methyl ketal, and alkyl ethers thereof may be used The amount of the photopolymerization initiator used is preferably 0.5 parts by weight or more and 20 parts by weight or less, and is more preferably 1 parts by weight or more and 5 parts by weight or less.

Examples of suitable materials for the refractive index adjusting particles 106b include, for example, metal oxide such as zirconia oxide (refractive index of 2.4), titanium oxide (refractive index of 2.52, 2.71), and zinc oxide (refractive index of 1.95).

Among them, zirconia oxide and titanium oxide are specifically preferred as the material of the refractive index adjusting particles 106b for reasons of a higher refractive index, chemical stability, the smaller absorbed amount of light in the visual light range, and particle diameters.

As the refractive index adjusting particles 106b, one type of particles included in the above particles may be used, or mixed particles obtained by mixing two or more types of particles included in the above particles may be used.

The scattering particles 106A are elements that scatter the light entering the base material part 106B. The scattering particles 106A are formed of a transparent material having refractive index $n_A$ different from the refractive index $n_{BH}$ of the base material part 106B, and are scattered inside the base material part 106B.

Materials suited for the scattering particles 106A include, for example, inorganic particles such as silica, alumina, and titanium oxide, and organic particles such as silicone, melamine, acrylic, and acrylic-styrene copolymer particles.

As the scattering particles 106A dispersed in the base material part 106B, particles made of one type of material may be used, or particles obtained by mixing particles made of two or more types of materials may be used.

The light scattering layer 106 has composition in which a ratio by weight $W_H$ of the refractive index adjusting particles 106b to the binder 106a and a ratio by weight $W_A$ of the scattering particles 106A to the binder 106a satisfy the following expression (1).

$$2 \leq W_H/W_A 9 \tag{1}$$

If $W_H/W_A$ is less than 2, the content of the refractive index adjusting particles 106b with respect to the scattering particles 106A is too low. Hence, to increase the refractive index of the base material part 106B, if the amount of the refractive index adjusting particles 106b is increased, the amount of the scattering particles 106A becomes too large, whereby the distances between the scattering particles 106A become small. As a result, light components reflected from the transparent electrode 104 by the scattering particles 106A increases, whereby the transmittance of the light scattering layer 106 decreases.

In contrast, when the content is set so that the scattering particles 106A are dispersed at sufficient distances, to prevent the transmittance of the light scattering layer 106 becoming too low, the refractive index $n_{BH}$ appropriate for the base material part 106B cannot be obtained because the content of the refractive index adjusting particles 106b in the base material part 106B becomes too small. As a result, the difference between the refractive index $n_{BH}$ of the base material part 106B and the refractive index of the transparent electrode 104 becomes too large, whereby total reflection from the interface between the base material part 106B and the transparent electrode 104 cannot be reduced.

When $W_H/W_A$ exceeds 9, the content of the refractive index adjusting particles 106b with respect to the scattering particles 106A becomes excessive, whereby agglomeration between the scattering particles 106A becomes strong. Hence, the scattering particles 106A are dispersed in the base material part 106B in a state where the scattering particles 106A are aggregated in lumps. Since the cross-sectional area of the scattering particles 106A, which have aggregated in lumps as described, becomes larger, light components reflected from the transparent electrode 104 increase. As a result, the transmittance of the light scattering layer 106 lowers.

In addition, in this case, as $W_H/W_A$ increases, the absolute number of the scattering particles 106A decreases, or the distances between the scattering particles 106A in lumps increase due to the aggregation of the scattering particles 106A described above. Thus, since the amount of light which enters the light scattering layer 106 and reaches the interface between the light scattering layer 106 and the translucent substrate 107 without being scattered increases, the total reflection from the interface between the light scattering layer 106 and the translucent substrate 107 becomes difficult to reduce.

Note that $W_H/W_A$ is further preferably within a range narrower than that of the expression (1). For example, the range of $W_H/W_A$ is preferably 4 or more and 7 or less.

In addition, in the light scattering layer 106, the refractive index $n_A$ of the scattering particles 106A and the refractive index $n_{BH}$ of the base material part 106B preferably satisfy the following expression (2).

$$0.05 \leq |n_{BH} - n_A| \leq 0.5 \tag{2}$$

When the value of $|n_{BH} - n_A|$ (absolute value of $n_{BH} - n_A$) is less than 0.05, since the values of the refractive indexes of the base material part 106B and the scattering particles 106A are too close to each other, scattering performance of the scattering particles 106A becomes lowered. Hence, since the total reflection from the interface between the light scattering layer 106 and the translucent substrate 107 cannot be so much reduced, the light extraction efficiency of the EL element 111 easily decreases.

When the value of $|n_{BH} - n_A|$ is more than 0.5, the scattering by the scattering particles 106A becomes strong, whereby the transmittance of the light scattering layer 106 easily lowers.

In addition, in the light scattering layer 106, the refractive index adjusting particles 106b are preferably polydisperse particles whose particle diameters RH are distributed in a range of 1 nm or more and 300 nm or less. In addition, the scattering particles 106A are preferably monodisperse particles having an average particle size, $R_A$ satisfying the following expression (2) where the thickness of the light scattering layer 106 is H.

Note that, by setting the particle diameter RH within a range of 10 nm or more and 300 nm or less, dispersibility of the refractive index adjusting particles 106b can be further improved. Appropriately selecting the refractive index adjusting particles 106b having the particle diameter in the above range with considering the dispersibility can appropriately set the refractive index of the light scattering layer 106.

Here, "monodisperse particles" are a particle group whose particle size distribution is made a constant size, and whose particle size distribution is narrower. Typically, it means that the particle sizes of the particles are within a particle size range of an average particle size, $R_A \pm 1$ μm. More strictly, the particle sizes are $R_A - 1$ μm $\leq$ D10, and D90 $\leq R_A + 1$ μm.

In contrast, "polydisperse particles" are a particle group whose particle sizes are not constant, and whose particle size distribution is wider. Typically, polydisperse particles mean that the particle sizes of the particles are within a particle size range wider than the particle size range of the average particle size $R_A \pm R_A \times 0.1$ μm. More strictly, it means that the particle sizes meet the condition, $D10 \leq R_A - R_A \times 0.1$ μm, and $R_A + R_A \times 0.1$ μm $\leq D90$.

Note that, regarding D10 and D90, when the position indicating a fine particle size in the particle size distribution is defined as zero, and an oversize cumulative distribution that represents an upward sloping curve to the right is shown, the particle size whose cumulative value is 10% is D10, and the particle size whose cumulative value is 90% is D90.

$$1.5 \leq H/R_A \leq 20 \tag{3}$$

When $H/R_A$ is less than 1.5, since the scattering particles 106A are larger considering the thickness of the light scattering layer 106, scattering becomes strong. Hence, the transmittance of the light scattering layer 106 easily lowers.

When $H/R_A$ is more than 20, since the scattering particles 106A are smaller considering the thickness of the light scattering layer 106, scattering becomes weak. Hence, the light extraction efficiency of the EL element 111 easily lowers.

In addition, a smoothing layer (overcoat layer), which prevents the scattering particles 106A from projecting and planarizes the interface, may be provided at a position where the interface between the light scattering layer 106 and the transparent electrode 104 is formed.

In a case where the scattering particles 106A are exposed on the interface between the light scattering layer 106 and the transparent electrode 104, and concavities and convexities are generated on the interface, for example, when the transparent electrode 104 is formed on the light scattering layer 106, the surface of the transparent electrode 104 may be formed so as to have a shape following the concavities and convexities of the surface of the light scattering layer 106, or the thickness of the transparent electrode 104 may become non-uniform. In this case, problems may be caused in electrical characteristics of the transparent electrode 104, and a short circuit, may be generated.

Providing the smoothing layer is desirable because the problems described above can be reliably prevented.

As the material forming the smoothing layer, a resin material may be employed which has a refractive index close to the refractive indexes of the respective transparent electrode 104 and light scattering layer 106. The same material as that of the base material part 106B of the light scattering layer 106 is specifically preferable.

As shown in FIG. 6A, the translucent substrate 107 is a plate-like or sheet-like member through which the light, which has penetrated through the light scattering layer 106 from the light-emitting structure 105, is penetrated toward the glass substrate 110.

As the material of the translucent substrate 107, an appropriate translucent material having a good transmittance may be employed.

The transmittance of the translucent substrate 107 is preferably 85% or more.

Examples of suitable materials used for the translucent substrate 107 include films made of polyethylene terephthalate (PET), triacetyl cellulose (TAC), diacetylcellulose, acetyl cellulose butyrate, polyethylene naphthalate (PEN), cyclo-olefin polymer, polyimide, polyether sulfone (PES), polymethylmethacrylate (PMMA), or polycarbonate (PC).

These materials are preferable in that they have appropriate transparency and mechanical strength and an appropriate refractive index.

The glass substrate 110 is a translucent member forming a surface of the lighting device 112 at the light-emitting side.

The glass substrate 110 is stuck on a surface of the translucent substrate 107 opposed to the light scattering layer 106, via an adhesive layer 109 formed of a transparent adhesive, pressure sensitive adhesive, or the like.

As the material of the adhesive layer 109, for example, an acrylic adhesive, pressure sensitive adhesive, or the like may be employed.

To prepare the above lighting device 112, for example, a coating liquid is prepared, in which the refractive index adjusting particles 106b and the scattering particles 106A are dispersed in the uncured binder 106a, and the coating liquid is applied to the surface of the translucent substrate 107, to form the light scattering layer 106.

Next, depending on the curing type of binder 106a, for example, the binder 106a is cured by irradiation of ionizing radiation or heating to form the light scattering layer 106 on the surface of the translucent substrate 107. Thereby, the EL element substrate 108 is obtained.

Next, the transparent electrode 104 is formed on the light scattering layer 106 of the EL element substrate 108, and the light-emitting layer 103 and the counter electrode 102 are formed in order, whereby a plurality of light-emitting structures 105 are formed.

Thereafter, the counter substrate 101 is disposed in a state where the light-emitting structure 105 is sandwiched between the counter substrate 101 and the EL element substrate 108 to make the light-emitting structure 105 closely adhere to the counter substrate 101 by, for example, lamination. Thereby, the EL element 111 is formed.

Next, the glass substrate 110 is stuck on the translucent substrate 107 of the EL element 111 via the adhesive layer 109. Hence, the lighting device 112 is formed.

The liquid crystal display device 150 can be prepared by disposing the glass substrate 110 of the lighting device 112 at a back surface of the liquid crystal panel 113 so as to face the liquid crystal panel 113.

Next, operation and functions of the liquid crystal display device 150 and the lighting device 112 are described focusing on operation and functions of the EL element 111.

In the second embodiment, when a DC voltage is applied between the transparent electrode 104 and the counter electrode 102 from the drive part, not shown, holes are injected from the transparent electrode 104 into the light-emitting layer 103, and electrons are injected from the counter electrode 102 into the light-emitting layer 103. The injected electrons and holes are recombined and generate excitons. When the excitons decay, light is emitted from the light-emitting layer 103.

Of the light generated from the light-emitting layer 103, the light traveling toward the transparent electrode 104 enters the transparent electrode 104, and the light traveling toward the counter electrode 102 is reflected from the counter electrode 102 or the counter substrate 101, and thereafter enters the transparent electrode 104.

The light, which has entered the transparent electrode 104, penetrates through the light scattering layer 106 depending on the angle of incidence.

In the light scattering layer 106, the scattering particles 106A are dispersed in the base material part 106B that is adjusted by the refractive index adjusting particles 106b so as to have the refractive index $n_{BH}$.

In the second embodiment, the refractive index $n_{BH}$ of the base material part 106B is higher than the refractive index $n_T$ of the translucent substrate 107. Hence, compared with a case where translucent substrate 107 is directly laminated on the transparent electrode 104, more light enters the light scattering layer 106, whereby the total reflection from the interface between the EL element substrate 108 and the transparent electrode 104 is reduced.

When the light having entered the light scattering layer 106 reaches the scattering particles 106A, the light is refracted depending on the refractive index difference between the scattering particles 106A and the base material part 106B and penetrates through the scattering particles 106A. Alternatively, after the light repeats internal reflection in the scattering particles 106A, the light is emitted from the scattering particles 106A. Hence, the light entering the scattering particles 106A is scattered around the incident direction.

In the second embodiment, $W_H/W_A$ satisfies the above expression (1). Hence, in a state where the refractive index $n_{BH}$ is excellently adjusted, the scattering particles 106A do not aggregate but are distributed in the base material part 106B and in the direction across the electrode plane of the transparent electrode 104 being appropriately separated.

Hence, the light, which enters the light scattering layer 106 and thereafter travels in a direction forming an angle of incidence less than the critical angle with respect to the interface between the light scattering layer 106 and the translucent substrate 107, has a high probability of passing through spaces between the scattering particles 106A and enters the translucent substrate 107 without being totally reflected from the interface between the light scattering layer 106 and the translucent substrate 107. In addition, since the scattering particles 106A are not aggregated, the light having entered the scattering particles 106A also has a smaller sectional area subject to scattering, and the number of light components scattered toward the translucent substrate 107 becomes larger than the number of light components reflected toward the transparent electrode 104.

Meanwhile, the light, which enters the light scattering layer 106 and thereafter travels in the direction forming an angle of incidence more than the critical angle with respect to the interface between the light scattering layer 106 and the translucent substrate 107, travels a longer distance within the light scattering layer 106. Hence, the light has a higher probability of entering the scattering particles 106A compared with the light having a smaller angle of incidence.

Thus, according to the light scattering layer 106 satisfying the above expression (1), compared with a case where the EL element substrate 108 is configured only by the translucent substrate 107, the amount of light entering from the transparent electrode 104 to the translucent substrate 107 increases. The light having entered the translucent substrate 107 is emitted to the outside of the EL element 111.

Hence, since the EL element 111 includes the EL element substrate 108 having the light scattering layer 106, the light extraction efficiency of the light entering from the light-emitting structure 105 can be improved.

Since the lighting device 112 according to the second embodiment includes the above EL element 111 having high light extraction efficiency, power consumption can be reduced when illumination light is produced.

Since the EL element 111 according to the second embodiment further satisfies the above expression (2) or the above expression (3), very good light extraction efficiency can be obtained.

(First Modification)
Next, a liquid crystal display device of the first modification according to the second embodiment is described.

Figure 7:
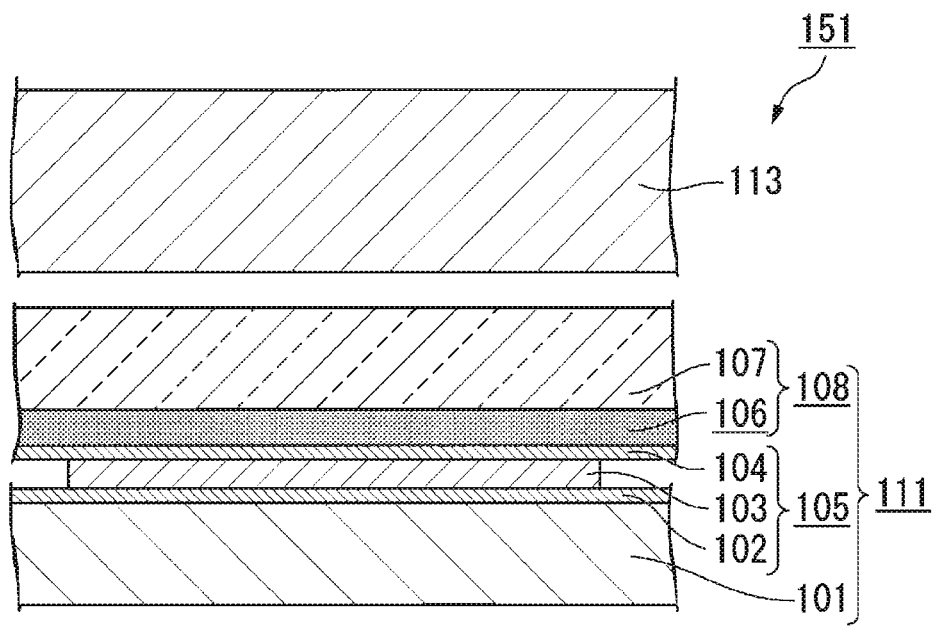
FIG. 7 is a sectional view schematically showing a configuration of a liquid crystal display device according to a first modification of the second embodiment of the present invention.

FIG. 7 is a sectional view schematically showing a configuration of the liquid crystal display device according to the first modification of the second embodiment of the present invention.

As shown in FIG. 7, a liquid crystal display device 151 of the present modification differs from the liquid crystal display device 150 according to the second embodiment in that the EL element 111 similar to that of the second embodiment is included instead of the lighting device 112.

That is, the liquid crystal display device 151 has a configuration in which the adhesive layer 109 and the glass substrate 110 are eliminated from the liquid crystal display device 150 according to the second embodiment.

The EL element 111 of the present modification is disposed on the back surface of the liquid crystal panel 113 and configures a backlight supplying illumination light for illuminating the liquid crystal panel 113. Hence, the present modification is an example in which the EL element 111 itself is used as a lighting device.

Since the liquid crystal display device 151 includes the EL element 111 as a lightning device as in the case of the second embodiment, advantageous effects similar to those of the second embodiment are provided.

(Second Modification)
Next, the second modification of the EL element and the display device according to the second embodiment is described.

Figure 8:
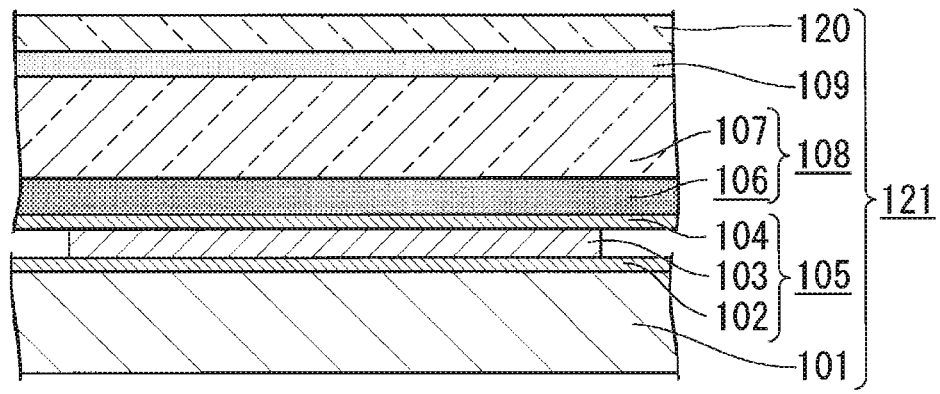
FIG. 8 is a sectional view schematically showing a configuration of a second modification of the EL element according to the second embodiment of the present invention.

FIG. 8 is a sectional view schematically showing a configuration of the second modification of the EL element according to the second embodiment of the present invention.

As shown in FIG. 8, an EL element 121 of the present modification has a configuration in which the counter substrate 101, the light-emitting structure 105, and the EL element substrate 108, which are also included in the second embodiment, are laminated in this order, and a barrier film 120 is laminated on the translucent substrate 107 via the adhesive layer 109. That is, the EL element 121 has a configuration similar to the lighting device 112 according to the second embodiment, the configuration including a substrate, which is provided with the barrier film 120, instead of the glass substrate 110.

The EL element 121 of the present modification can be used as a lighting device such as a backlight. For example, in the liquid crystal display device 150 according to the second embodiment, the EL element 121 can be used instead of the lighting device 112.

In addition, since the EL element 121 can be subject to pixel driving as in the case of the EL element 111, the EL element 121 can be used as a display device in which the EL element 121 itself serves as a display unit. Hereinafter, the points different from those of the above second embodiment are mainly described.

The barrier film 120 configures a surface of the EL element 121 opposed to the counter substrate 101. The barrier film 120 is a sheet-like member protecting the light-emitting structure 105 from moisture, outside air, and the like, and has appropriate mechanical strength, flexibility, and translucency.

The transmittance of the barrier film 120 is preferably 85% or more. The refractive index of the barrier film 120 is preferably close to the refractive index of the light scattering layer 106.

The barrier film 120 may be, for example, a film formed by vapor deposition, sputtering, or the like of silicon oxide, alumina, or the like on the base material such as PET.

According to the EL element 121 having the above configuration, since the EL element substrate 108 is provided, the light extraction efficiency can be improved as in the case of the EL element 111 of the second embodiment.

In addition, the whole of the EL element 121 can include flexibility by configuring the counter substrate 101 and the translucent substrate 107 by materials having flexibility as in the case of the barrier film 120. According to the above EL element 121, a curved display surface or lighting surface can be formed.

Note that, in the second embodiment, an example is described in which the surface of the lighting device 112 at the light-emitting side is formed of the flat glass substrate 110. However, the glass substrate 110 is not limited to flat glass. For example, an optical sheet may be used which is provided with an appropriate lens or diffusion layer for light condensing or light diffusion. Alternatively, a structure may be used in which the above optical sheet is laminated on the glass substrate 110.

In addition, all the elements described above may be implemented by changing the combination thereof or by eliminating any of them within the scope of the technical idea of the present invention.

For example, the EL element 111 according to the second embodiment may be used as a display device in which the EL element 111 itself serves as a display unit as in the case of the EL element 121 of the second modification.

In addition, the lighting device 112 according to the second embodiment may be also used as a display device displaying an image or the like by causing the EL element 111 to drive pixels.

Hereinbefore, preferred embodiments of the present invention are described. However the above descriptions are illustrations of the present invention, and it should be understood that it should not be considered that the above descriptions limit the present invention. Addition, omission, replacement, and other modifications may be performed without departing from the scope of the present invention. Hence, it should not be considered that the present invention is limited to the above descriptions, but the present invention is limited to the claims.

EXAMPLES

Hereinafter, examples 1 to 6 corresponding to the EL element 111 according to the second embodiment are described in addition to comparative examples 1 to 4.

In all the examples 1 to 6 and the comparative examples 1 to 4, the respective configurations of the counter substrates 101, the light-emitting structures 105, and the translucent substrates 107 are the same, and only the respective configurations of the light scattering layers 106 and the layered parts corresponding to the light scattering layers 106 (hereinafter, these may be simply referred to as light scattering layers) are different from each other.

In the following table 1, conditions for forming the light scattering layers of the examples 1 to 6 and the comparative examples 1 to 4 are described.

TABLE 1

| | Coating Fluid | $W_H$ | $W_A$ | $n_{BH}$ | $n_A$ | H (μm) | $R_A$ (μm) |
|---|---|---|---|---|---|---|---|
| Example 1 | #1 | 180 | 30 | 1.70 | 1.49 | 7 | 2.0 |
| Example 2 | #2 | 350 | 40 | 1.78 | 1.49 | 6 | 0.8 |
| Example 3 | #3 | 40 | 20 | 1.60 | 1.52 | 7 | 1.0 |
| Example 4 | #4 | 45 | 20 | 1.60 | 1.49 | 3 | 2.5 |
| Example 5 | #5 | 60 | 25 | 1.62 | 1.53 | 15 | 0.7 |
| Example 6 | #6 | 180 | 35 | 1.71 | 1.52 | 4 | 2.0 |
| Comparative Example 1 | #7 | 30 | 30 | 1.58 | 1.52 | 6 | 1.5 |

TABLE 1-continued

| | Coating Fluid | $W_H$ | $W_A$ | $n_{BH}$ | $n_A$ | H (μm) | $R_A$ (μm) |
|---|---|---|---|---|---|---|---|
| Comparative Example 2 | #8 | 300 | 30 | 1.78 | 1.52 | 10 | 2.0 |
| Comparative Example 3 | #9 | 20 | 25 | 1.55 | 1.54 | 5 | 1.0 |
| Comparative Example 4 | #10 | 0 | 25 | 1.52 | 1.49 | 5 | 2.5 |

Example 1

The EL element 111 of the example 1 was formed in the following manner.

As the translucent substrates 107, A4300 (trade name; manufactured by Toyobo Co., Ltd.) was used which was a polyethylene terephthalate film having a thickness of 125 μm. A4300 had a transmittance of 92.3% and a refractive index $n_T$ of 1.60.

As the binder matrix formation materials forming the base material part 106B of the light scattering layer 106, acrylic UV curing resin (manufactured by Kyoeisha Chemical Co., Ltd.) having a refractive index of 1.52 which is cured to produce the binder 106a, photopolymerization initiator (manufactured by BASF), zirconia dispersion (manufactured by Solar Co., Ltd.) that is high refractive index fine particles and serves as the refractive index adjusting particles 106b, and acrylic/styrene copolymer (manufactured by Soken Chemical & Engineering Co., Ltd.) serving as the scattering particles 106A were prepared.

The above materials were appropriately combined with each other to form a coating liquid #1. Specifications of the coating liquid #1 are shown in the table 1.

That is, the refractive index adjusting particles 106b and the scattering particles 106A were combined with each other so that respective ratios by weight thereof to the binder 106a are $W_H$=180 and $W_A$=30.

The scattering particles 106A were dispersed in an MEK solvent, and were monitored by using a nano particle size distribution measuring apparatus SALD-7100 (trade name; manufactured by Shimadzu Corporation). The results were that the scattering particles 106A are monodisperse particles, and the average particle size $R_A$ of the scattering particle 106A is $R_A$=2 (μm).

In addition, a dispersion liquid of the refractive index adjusting particles 106b was diluted and was monitored in a similar manner. The results were that the refractive index adjusting particles 106b are polydisperse particles, and the particle size RH of the refractive index adjusting particle 106b is 28 nm.

The refractive index of the scattering particles 106A was determined by an immersion method. The result was $n_A$=1.49.

The immersion method is the following measuring method. Fine particles to be measured are immersed in a dispersion liquid whose refractive index is changed. Light is emitted to the dispersion liquid. When the light scattered by the fine particles in the dispersion liquid becomes invisible, the refractive index of the dispersion liquid is determined as the refractive index of the fine particles.

Next, the coating liquid #1 was applied to the surface of the translucent substrate 107 by a slot die coater, and the solvent included in the coating liquid #1 was made to evaporate. Thereafter, by using a high-pressure mercury vapor lamp, ultraviolet light at 400 mJ/cm² was emitted to the coating liquid #1 in an atmosphere having an oxygen concentration of 0.03% or less to cure the coating liquid #1. Thereby, the light scattering layer 106 having the thickness H of 7 μm was formed. Accordingly, the EL element substrate 108 of the example 1 was obtained.

In addition, to evaluate the EL element 111, ITO having the refractive index $n_E$=1.90 was subject to film formation on the light scattering layer 106 of the obtained EL element substrate 108 as the transparent electrode 104. Further, the light-emitting layer 103 and the counter electrode 102 were formed, and then the counter substrate 1 was stuck thereon, whereby the EL element substrate 111 of the example 1 was obtained.

Here, an average film thickness of the thickness H of the light scattering layer 106 was determined by performing local film thickness measurement of specified portions uniformly distributed over an effective surface area by using an electronic micrometer (Digimicro MU-501A manufactured by Nikon Corporation) and in accordance with JIS-K5600-1999. Note that the effective surface area was defined as a square with sides of 0.1 m, and the number of the specified portions was defined as ten.

To measure the refractive index $N_{BH}$ of the base material part 106B, a coating liquid for measurement was prepared by combing the refractive index adjusting particles by the ratio by weight $W_H$ with respect to the binder 106a, followed by coating and curing to form a film as a refractive index measurement sample.

Then, the refractive index of the refractive index measurement sample was measured by using a reflectance spectroscopy film thickness monitor FE-3000 (trade name; manufactured by Otsuka Electronics Co., Ltd.). The result was $n_{BH}$=1.70.

Examples 2 to 6

In the examples 2 to 6, the types of the binder 106a and the refractive index adjusting particles 106b were common to those of the example 1, and the scattering particles 106A were changed in only the refractive index and the particle size. Different coating liquids #2 to #6 were prepared by changing the blending amount of particles. The thickness of the light scattering layer 106 was changed as needed. Thereby, the EL element substrate 108 and the EL element 111 were produced.

The example 2 differs from the example 1 in that the coating liquid #2 was prepared in which the scattering particles 106A are combined, where $n_A$=1.49, $R_A$=0.8 (μm), $W_H$=350, and $W_A$=40, and was applied to the translucent substrate 107 and cured, whereby the light scattering layer 106 of H=6 (μm) was formed. According to the present example, the result was n $g_{BH}$=1.78.

The example 3 differs from the example 1 in that the coating liquid #3 was prepared in which the scattering particles 106A are combined, where $n_A$=1.52, $R_A$=1.0 (μm), $W_H$=40, and $W_A$=20, and was applied to the translucent substrate 107 and cured, whereby the light scattering layer 106 of H=7 (μm) was formed. According to the present example, the result was $n_{BH}$=1.60.

The example 4 differs from the example 1 in that the coating liquid #4 was prepared in which the scattering particles 106A are combined, where $n_A$=1.49, $R_A$=2.5 (μm), $W_H$=45, and $W_A$=20, and was applied to the translucent substrate 107 and cured, whereby the light scattering layer 106 of H=3 (μm) was formed. According to the present example, the result was $n_{BH}$=1.60.

The example 5 differs from the example 1 in that the coating liquid #5 was prepared in which the scattering particles 106A are combined, where $n_A$=1.53, $R_A$=0.7 (μm), $W_H$=60, and $W_A$=25, and was applied to the translucent substrate 107 and cured, whereby the light scattering layer 106 of H=15.0 (μm) was formed. According to the present example, the result was $n_{BH}$=1.62.

The example 6 differs from the example 1 in that the coating liquid #6 was prepared in which the scattering particles 106A are combined, where $n_A$=1.52, $R_A$=2.0 (μm), $W_H$=350, and $W_A$=40, and was applied to the translucent substrate 107 and cured, whereby the light scattering layer 106 of H=4 (μm) was formed. According to the present example, the result was $n_{BH}$=1.71.

Comparative Examples 1 to 4

In the comparative examples 1 to 4, the types of the binder 106a and the refractive index adjusting particles 106b were common to those of the example 1, and the scattering particles 106A were changed in only the refractive index and the particle size. Different coating liquids #7 to #10 were prepared by changing the amount of particles. The thickness of the light scattering layer was changed. Thereby, the EL element substrate and the EL element of the comparative example were made.

The comparative example 1 differs from the example 1 in that the coating liquid #7 was prepared in which the scattering particles 106A are combined, where $n_A$=1.52, $R_A$=1.5 (μm), $W_H$=30, and $W_A$=30, and was applied to the translucent substrate 107 and cured, whereby the light scattering layer with H=6 (μm) was formed. According to the present comparative example, the result was $n_{BH}$=1.58.

The comparative example 2 differs from the example 1 in that the coating liquid #8 was prepared in which the scattering particles 106A are combined, where $n_A$=1.52, $R_A$=2.0 (μm), $W_H$=300, and $W_A$=30, and was applied to the translucent substrate 107 and cured, whereby the light scattering layer with H=10 (μm) was formed. According to the present comparative example, the result was $n_{BH}$=1.78.

The comparative example 3 differs from the example 1 in that the coating liquid #9 was prepared in which the scattering particles 106A are combined, where $n_A$=1.54, $R_A$=1.0 (μm), $W_H$=20, and $W_A$=25, and was applied to the translucent substrate 107 and cured, whereby the light scattering layer with H=1 (μm) was formed. According to the present comparative example, the result was $n_{BH}$=1.55.

The comparative example 4 differs from the example 1 in that the coating liquid #10 was prepared in which the scattering particles 106A are combined, where $n_A$=1.49, $R_A$=2.5 (μm), $W_H$=0, and $W_A$=25, and was applied to the translucent substrate 107 and cured, whereby the light scattering layer having of H=5 (μm) was formed. According to the present comparative example, the result was $n_{BH}$=1.52.

EVALUATION

For each of the examples 1 to 6 and the comparative examples 1 to 4, the light extraction efficiency of the EL element, the transmittance of the light scattering layer, the agglomeration state of the scattering particles in the light scattering layer, comprehensive evaluation, and values regarding the above expressions (1) to (3) were evaluated. The results are shown in the following table 2.

TABLE 2

|  | $W_H/W_A$ | $n_{BH} - n_A$ | $H/R_A$ | Expression (1) | Expression (2) | Expression (3) | Efficiency | Transmittance | Agglomeration | Comprehensive Evaluation |
|---|---|---|---|---|---|---|---|---|---|---|
| Example 1 | 6.00 | 0.21 | 3.5 | ○ | ○ | ○ | ⊙ | ○ | ○ | ⊙ |
| Example 2 | 8.75 | 0.29 | 7.5 | ○ | ○ | ○ | ⊙ | ○ | ○ | ⊙ |
| Example 3 | 2.00 | 0.08 | 7.0 | ○ | ○ | ○ | ⊙ | ○ | ○ | ⊙ |
| Example 4 | 2.25 | 0.11 | 1.2 | ○ | ○ | X | ○ | X | ○ | ○ |
| Example 5 | 2.40 | 0.09 | 21.4 | ○ | ○ | X | ○ | ○ | ○ | ○ |
| Example 6 | 5.14 | 0.19 | 2.0 | ○ | ○ | ○ | ⊙ | ○ | ○ | ⊙ |
| Comparative Example 1 | 1.00 | 0.06 | 4.0 | X | ○ | ○ | X | ○ | ○ | X |
| Comparative Example 2 | 10.00 | 0.26 | 5.0 | X | ○ | ○ | X | X | X | X |
| Comparative Example 3 | 0.80 | 0.01 | 5.0 | X | X | ○ | X | ○ | ○ | X |
| Comparative Example 4 | 0.00 | 0.03 | 2.0 | X | ○ | ○ | X | ○ | ○ | X |

To evaluate the light extraction efficiency, each total luminous flux obtained by making the EL element of each of the examples and comparative examples emit light, and a total luminous flux from an EL element for comparison, from which the light scattering layer is eliminated, were measured. Then, relative evaluation was made based on a ratio of increase of the luminous flux with respect to the total luminous flux of the EL element for comparison.

The total luminous fluxes were measured by using LMS-400 (trade name; manufactured by Labsphere, Inc.), which is a total luminous flux measuring instrument using an integrating sphere.

The evaluation results are shown in the column "Efficiency" in the table 2, where if the rate of increase of the luminous flux is 20% or more, "⊙" (very good) is written, if the rate of increase of the luminous flux is 5% or more and less than 20, "○" (good) is written, and if the rate of increase of the luminous flux is less than 5%, "X" (no good) is written.

The transmittance of the light scattering layer was determined based on the difference between the transmittance of the EL element substrate and the transmittance of the translucent substrate 107 of each of the examples and the comparative examples. The transmittances were measured by using a spectrophotometer U-4100 (trade name; manufactured by Hitachi High-Technologies Corporation).

The evaluation results are shown in the column "Transmittance" in the table 2, where if the transmittance is 80% or more, "○" (good) is written, and if the transmittance is less than 80%, "X" (no good) is written.

The agglomeration state of the scattering particles in the light scattering layer was evaluated by observing the light scattering layer of the EL element substrate of each of the examples and the comparative examples by using an optical microscope MX50T-877MD (trade name; manufactured by Olympus Corporation).

The evaluation results are shown in the column "Agglomeration" in the table 2, where if the agglomeration is not recognized, "○" (good) is written, and if the agglomeration is recognized, "X" (no good) is written.

To make the comprehensive evaluation, three-step determination was made mainly based on the light extraction efficiency. The determination results are written by "⊙" (very good), "○" (good), and "X" (no good).

In addition, the table 2 shows calculated values of various amounts corresponding to the above expressions (1) to (3). If each of the examples and the comparative examples satisfies the above expressions (1) to (3), "○" (good) is written. If each of the examples and the comparative examples does not satisfy the above expressions (1) to (3), "X" (no good) is written.

According to the table 2, the examples 1 to 3, and 6 satisfy all the above expressions (1) to (3). The examples 4 and 5 satisfy the above expressions (1) and (2). The comparative examples 1, 2, and 4 do not satisfy the expression (1). The comparative example 3 does not satisfy the expressions (1) and (2).

As shown in the table 2, in all the examples 1 to 6 satisfying the expression (1), the light extraction efficiency was favorable, and the comprehensive evaluation was "⊙" (very good) or "○" (good).

In contrast, in the comparative examples 1 to 4, since the expression (1) is not satisfied, the light extraction efficiency was not favorable, and the comprehensive evaluation was "X" (no good).

Note that, in the examples 4 and 5, since the above expression (3) is not satisfied, the result was that the light extraction efficiencies are lower than those of the examples 1 to 3, and 6.

The conventional technology described above has the following problem.

As in the technology disclosed in Patent Literature 1, when microlens elements are provided on the surface of the translucent substrate, some optical components are reflected toward a light-emitting layer side depending on the angle of incidence to the microlens elements. Such optical components have a problem of tending to reduce the amount of light because the optical components return to the inside of the EL element.

Hence, according to the technology disclosed in Patent Literature 1, although the light extraction efficiency can be improved compared with the case where the microlens elements are not provided, it is desired to improve the light extraction efficiency further.

Furthermore, in the case of Patent Literature 2, the refractive index of the transparent electrode used in the light-emitting structure is higher than the refractive index of typical transparent resin, glass, or the like. Hence, the transparent resin matrix of the layer (hereinafter, referred to as light scattering layer), which has the light scattering function, adjacent to the transparent electrode is needed to be formed of a material having a high refractive index close to the refractive index of the transparent electrode, to suppress the total reflection from the interface between the transparent resin matrix and the transparent electrode. However, since the refractive index of a resin material, which can disperse the transparent particles, is not larger than that of the transparent electrode, a problem is caused that the total reflection is difficult to be reduced.

In addition, to increase the light extraction efficiency, it is necessary to properly set the size and the distribution density of the transparent particles of the light scattering layer. However, the transparent particles used for scattering light easily aggregate inside the transparent resin matrix. Since the agglomeration among the transparent particles adversely affects light scattering performance and a transmittance, the blending amount of the transparent particles is limited.

Hence, technology has been desired which further improves the light extraction efficiency by using a light scattering layer.

The present invention can provide an EL element and an EL element substrate that can improve light extraction efficiency.

In addition, the present invention can provide a lighting device, a display device, and a liquid crystal display device that can reduce power consumption (improve power saving performance) by including the above EL element.

An EL element according to a first aspect of the present invention includes: an EL light-emitting part in which a transparent electrode, a light-emitting layer, and a counter electrode are laminated in this order; a translucent substrate, on a surface of which an optical sheet is disposed which has a concavo-convex shape and emits light generated from the light-emitting layer to the outside; and a light scattering layer that is configured by including light scattering particles, and has a first surface on which a concavo-convex shape is formed of agglomerations, in which the light scattering particles are aggregated, and which faces the transparent electrode of the EL light-emitting part; and a second surface on which the light scattering particles are arranged in a dense state across a face that is smoother than the concavo-convex shape of the first surface and which faces the translucent substrate, the light scattering layer being disposed between the EL light-emitting part and the translucent substrate.

In the EL element according to the first aspect of the present invention, the light scattering layer may be joined to the transparent electrode via a smoothing layer having light transmissivity, the smoothing layer forming a smooth joint surface covering the concavo-convex shape of the first surface.

The EL element according to the first aspect of the present invention may further include a sheet-like base material that has translucency and is joined to a surface of the translucent substrate via a joint layer, the surface facing the light scattering layer. The light scattering particles provided to the second surface may be arranged across a surface opposed to the surface, to which the joint layer is provided, of the base material.

In the EL element according to the first aspect of the present invention, the light scattering particles provided to the second surface may be arranged across a surface opposed to the surface, to which the optical sheet is disposed, of the translucent substrate.

In the EL element according to the first aspect of the present invention, a particle density of the light scattering particles of the second surface of the light scattering layer may be higher than a particle density of the light scattering particles of the first surface of the light scattering layer.

In the EL element according to the first aspect of the present invention, an average particle size of the light scattering particles of the second surface of the light scattering layer may be smaller than an average particle size of the light scattering particles of the first surface of the light scattering layer.

A lighting device according to a second aspect of the present invention includes the EL element according to the first aspect described above as a light-emitting part.

A display device according to a third aspect of the present invention includes the EL element according to the first aspect described above. The EL light-emitting part of the EL element has a plurality of pixels that are capable of being independently driven.

A liquid crystal display device according to a fourth aspect of the present invention includes an image display element using liquid crystals, and the EL element according to the first aspect described above, the EL element being disposed on a back surface of the image display element.

A liquid crystal display device according to a fifth aspect of the present invention includes an image display element using liquid crystal, and the lighting device according to the second aspect described above, the lighting device being disposed on a back surface of the image display element.

On an EL element substrate according to a sixth aspect of the present invention, a light-emitting structure is disposed which has an electrode pair, at least one of which is configured by a transparent electrode, and a light-emitting layer sandwiched between the electrode pair. The EL element substrate forms an EL element. The EL element substrate according to the sixth aspect of the present invention includes: a translucent substrate, and a light scattering layer that has a base material part, in which refractive index adjustment particles having light transmissivity and a binder having light transmissivity are combined with each other to adjust a refractive index of the base material part to a constant value larger than a refractive index of the translucent substrate, and scattering particles, which are formed of a transparent material having a refractive index different from the refractive index of the base material part and which are dispersed inside the base material part, the light scattering layer being formed on one surface of the translucent substrate, and the translucent substrate of the light-emitting structure being arranged on the light scattering layer. A ratio by weight $W_H$ of the refractive index adjusting particles with respect to the binder and a ratio by weight $W_A$ of the scattering particles with respect to the binder satisfy a following expression (1):

$$2 \leq W_H/W_A \leq 9 \qquad (1).$$

In the EL element substrate according to the sixth aspect of the present invention, a following expression (2) may be satisfied:

$$0.05 \leq |n_{BH} - n_A| \leq 0.5 \qquad (2)$$

where $n_A$ is a refractive index of the scattering particles, and $n_{BH}$ is the refractive index of the base material part.

In the EL element substrate according to the sixth aspect of the present invention, the refractive index adjustment particles may be polydisperse particles distributed in a range of 1 nm or more and 300 nm or less, and the scattering particles may be monodisperse particles satisfying a following expression (3):

$$1.5 \leq H/R_A \leq 20 \qquad (3)$$

where $R_A$ is an average particle size of the scattering particles, and H is a thickness of the light scattering layer.

An EL element according to a seventh aspect of the present invention includes the EL element substrate according to the sixth aspect described above; and a light-emitting structure having an electrode pair, at least one of which is configured by a transparent electrode, and a light-emitting layer sandwiched between the electrode pair. The translucent substrate of the EL element substrate has a refractive index lower than the refractive index of the translucent substrate. The transparent electrode of the light-emitting structure is disposed at a position opposed to the translucent substrate so that the light scattering layer of the EL element substrate is sandwiched between the translucent substrate and the transparent electrode.

In the EL element according to the seventh aspect of the present invention, the light-emitting structure may form a plurality of pixels which are capable of being independently driven.

A lighting device according to an eighth aspect of the present invention includes the EL element according to the seventh aspect described above as an illumination light source.

A display device according to a ninth aspect of the present invention includes the EL element according to the seventh aspect described above as a display unit.

A liquid crystal display device according to a tenth aspect of the present invention includes an image display element using liquid crystals, and the EL element according to the seventh aspect described above, the EL element being disposed on a back surface of the image display element as an illumination light source.

A liquid crystal display device according to an eleventh aspect of the present invention includes an image display element using liquid crystals, and the lighting device according to the eighth aspect described above, the lighting device being disposed on a back surface of the image display element.

The EL element according to the above aspect of the present invention includes the light scattering layer in which the first surface facing the transparent electrode and the second surface facing the translucent substrate have different arrangements of the light scattering particles. Hence, an advantageous effect is provided that light extraction efficiency can be improved.

In addition, the lighting device, the display device, and the liquid crystal display device according to the above aspects of the present invention include the EL element according to the above aspect of the present invention. Hence, an advantageous effect is provided that power saving performance can be improved.

According to the EL element substrate and the EL element according to the above aspects of the present invention, the light scattering layer has the base material part, in which the refractive index adjusting particles and the binder are combined with each other and whose refractive index is adjusted to be higher than that of the translucent substrate, and the scattering particles. The ratio by weight $W_H$ of the refractive index adjusting particles to the binder is set to two times or more and nine times or less the ratio by weight $W_A$ of the scattering particles to the binder. Hence, an advantageous effect is provided that the light extraction efficiency of the light entering from the light-emitting structure of the EL element can be improved.

In addition, the lighting device, the display device, and the liquid crystal display device according to the above aspects of the present invention include the EL element according to the above aspect of the present invention. Hence, an advantageous effect is provided that power consumption can be reduced.

REFERENCE SIGNS LIST 1, 101 counter substrate
2, 102 counter electrode
3, 103 light-emitting layer
4, 104 transparent electrode
4a surface
5, 105 light-emitting structure (EL light-emitting part)
6, 106 light scattering layer
6A first light scattering layer
6B second light scattering layer
6a first surface
6b second surface
7, 107 translucent substrate
7a incident side surface
8, 14 joint layer
9 light directional film (optical sheet)
9B light directional structural layer part
9a flat surface
9b unit prism lens
10, 20, 111, 121 EL element (lighting device, display device)
11 liquid crystal panel (image display element)
12 smoothing layer
12a joint surface
13 base material
15 assembly
16A, 16B light scattering particle
17 agglomeration
18 layered arrangement part
19A, 19B, 106a binder
50, 150, 151 liquid crystal display device
106A scattering particle
106B base material part
106b refractive index adjusting particle
108 EL element substrate
110 glass substrate
112 lighting device
113 liquid crystal panel (image display element using liquid crystals)
120 barrier film
B0, B1, B2, B2', B2", B3, B4, B5 light Obviously, numerous modifications and variations of the present invention are possible in light of the above teachings. It is therefore to be understood that within the scope of the appended claims, the invention may be practiced otherwise than as specifically described herein.

What is claimed is:

1. An EL element, comprising:
an EL light-emitting structure including a transparent electrode, a light-emitting layer on the transparent electrode, and a counter electrode on the light-emitting layer;
a translucent substrate through which a light generated from the light-emitting layer is emitted to outside; and
a light scattering layer positioned between the EL light-emitting structure and the translucent substrate, the light scattering layer having a first surface on a side of the transparent electrode and a second surface on a side of the translucent substrate,
wherein the light scattering layer includes a first light scattering layer comprising a plurality of first light scattering particles, and a second light scattering layer formed on the first light scattering layer and comprising a plurality of second light scattering particles such that the plurality of first light scattering particles forms a plurality of agglomerates and the first surface having a concavo-convex shape, that the plurality of second light scattering particles is positioned in order along the second surface and forms a layered arrangement portion at the second surface that is smoother than the first surface having the concavo-convex shape, and that the light scattering layer scatters incident light entering from the first light scattering layer and reflects incident light entering from the second light scattering layer.

2. The EL element of claim 1, further comprising:
a joint layer on a surface of the translucent substrate on a side of the light scattering layer; and
a base material which is positioned on the joint layer and has translucency,
wherein the base material faces the second surface of the light scattering layer.

3. The EL element of claim 1, further comprising:
an optical sheet positioned on a surface of the translucent substrate and having a surface that includes a portion having a concavo-convex shape,
wherein the translucent substrate has a surface which faces the second surface of the light scattering layer and is opposite to the surface on which the optical sheet is positioned.

4. The EL element of claim 1, wherein the second light scattering particles have an average particle size smaller than an average particle size of the first light scattering particles in the light scattering layer.

5. A display device, comprising:
the EL element of claim 1,
wherein the EL light-emitting structure of the EL element has a plurality of pixels capable of being independently driven.

6. A liquid crystal display device, comprising:
an image display element including a liquid crystal; and
the EL element of claim 1 positioned on a surface of the image display element.

7. The EL element of claim 1, wherein the second light scattering particles have a density higher than a density of the first light scattering particles in the light scattering layer.

8. The EL element of claim 7, wherein the second light scattering particles have an average particle size smaller than an average particle size of the first light scattering particles in the light scattering layer.

9. A lighting device, comprising:
the EL element of claim 1.

10. A liquid crystal display device, comprising:
an image display element including a liquid crystal; and
the lighting device of claim 9 positioned on a surface of the image display element.

11. The EL element of claim 1, further comprising:
a smoothing layer between the light scattering layer and the transparent electrode,
wherein the smoothing layer has light transmissivity and covers the concavo-convex shape of the first surface.

12. The EL element of claim 11, further comprising:
a joint layer on a surface of the translucent substrate on a side of the light scattering layer; and
a base material which is positioned on the joint layer and has translucency,
wherein the base material faces the second surface of the light scattering layer.

13. The EL element of claim 11, further comprising:
an optical sheet positioned on a surface of the translucent substrate and having a surface that includes a portion having a concavo-convex shape,
wherein the translucent substrate has a surface which faces the second surface of the light scattering layer and is opposite to the surface on which the optical sheet is positioned.

14. The EL element of claim 11, wherein the second light scattering particles have an average particle size smaller than an average particle size of the first light scattering particles in the light scattering layer.

15. A display device, comprising:
the EL element of claim 11,
wherein the EL light-emitting structure of the EL element has a plurality of pixels capable of being independently driven.

16. A liquid crystal display device, comprising:
an image display element including a liquid crystal; and
the EL element of claim 11 positioned on a surface of the image display element.

17. The EL element of claim 11, wherein the second light scattering particles have a density higher than a density of the first light scattering particles in the light scattering layer.

18. The EL element of claim 17, wherein the second light scattering particles have an average particle size smaller than an average particle size of the first light scattering particles in the light scattering layer.

19. A lighting device, comprising:
the EL element of claim 11.

20. A liquid crystal display device, comprising:
an image display element including a liquid crystal; and
the lighting device of claim 19 positioned on a surface of the image display element.

* * * * *